United States Patent
Nakamura et al.

(10) Patent No.: US 12,513,460 B2
(45) Date of Patent: Dec. 30, 2025

(54) ACOUSTIC PROCESSING DEVICE AND ACOUSTIC PROCESSING METHOD

(71) Applicant: PANASONIC INTELLECTUAL PROPERTY MANAGEMENT CO., LTD., Osaka (JP)

(72) Inventors: Kazuhiro Nakamura, Kanagawa (JP); Masafumi Tao, Kanagawa (JP)

(73) Assignee: PANASONIC AUTOMOTIVE SYSTEMS CO., LTD., Kanagawa (JP)

( * ) Notice: Subject to any disclaimer, the term of this patent is extended or adjusted under 35 U.S.C. 154(b) by 386 days.

(21) Appl. No.: 18/109,054

(22) Filed: Feb. 13, 2023

(65) Prior Publication Data

US 2023/0262389 A1    Aug. 17, 2023

(30) Foreign Application Priority Data

Feb. 14, 2022  (JP) ................................ 2022-020513

(51) Int. Cl.
*H04R 3/04*  (2006.01)
*H04R 29/00*  (2006.01)

(52) U.S. Cl.
CPC ............. *H04R 3/04* (2013.01); *H04R 29/001* (2013.01); *H04R 29/004* (2013.01); *H04R 2430/01* (2013.01); *H04R 2499/13* (2013.01)

(58) Field of Classification Search
CPC ...... H04R 3/04; H04R 29/001; H04R 29/004; H04R 2430/01; H04R 2499/13
See application file for complete search history.

(56) References Cited

U.S. PATENT DOCUMENTS

| 4,944,018 A | * | 7/1990 | Bose | H03G 3/32 |
| | | | | 381/86 |
| 5,907,622 A | * | 5/1999 | Dougherty | H03G 3/32 |
| | | | | 381/108 |

(Continued)

FOREIGN PATENT DOCUMENTS

| JP | 05-121983 | 5/1993 |
| JP | 06-319192 | 11/1994 |

(Continued)

OTHER PUBLICATIONS

Office Action issued in Japan Patent Application 2022-020513, dated May 7, 2025, together with English translation thereof.

*Primary Examiner* — Daniel R Sellers
(74) *Attorney, Agent, or Firm* — Greenblum & Bernstein, P.L.C.

(57) ABSTRACT

An acoustic processing device mountable on a vehicle, the acoustic processing device includes: a memory; and a processor coupled to the memory, and when executing a program stored in the memory, performs operations. The operations include: outputting a noise level obtained by subtracting a sound source level from a microphone level; outputting a velocity noise level indicating a frequency characteristic of a noise based on a velocity of the vehicle; outputting a volume sound source level; outputting an SN ratio which is a ratio between the volume sound source level and the velocity noise level; selecting based on the SN ratio, the estimated noise level candidates including a level related to the noise level and the velocity noise level; and outputting a selected one of the estimated noise level candidates as an estimated noise level.

16 Claims, 13 Drawing Sheets

(56) References Cited

U.S. PATENT DOCUMENTS

| | | | | |
|---|---|---|---|---|
| 2004/0125962 A1* | 7/2004 | Christoph | ............... | H03G 3/32 |
| | | | | 381/59 |
| 2004/0151328 A1* | 8/2004 | Hasegawa | ............... | H03G 3/32 |
| | | | | 381/86 |
| 2006/0111827 A1* | 5/2006 | Russlies | ............... | H03G 3/32 |
| | | | | 340/426.34 |
| 2006/0251261 A1* | 11/2006 | Christoph | ............... | H04R 3/04 |
| | | | | 381/1 |
| 2013/0332157 A1* | 12/2013 | Iyengar | ............... | G10L 21/0232 |
| | | | | 381/92 |
| 2015/0281864 A1* | 10/2015 | Song | ............... | H03G 3/32 |
| | | | | 381/56 |
| 2019/0198005 A1* | 6/2019 | Cheung | ............... | G10K 11/17883 |

FOREIGN PATENT DOCUMENTS

| | | |
|---|---|---|
| JP | 08-213861 | 8/1996 |
| JP | 3233574 | 11/2001 |
| JP | 2012-015665 | 1/2012 |

\* cited by examiner

ACOUSTIC PROCESSING DEVICE AND ACOUSTIC PROCESSING METHOD

TECHNICAL FIELD

The present disclosure relates to an acoustic processing device and an acoustic processing method.

BACKGROUND ART

A noise level in a vehicle varies between when the vehicle is stopped and when the vehicle is traveling. Therefore, in an acoustic device mounted on the vehicle, when the noise level increases as the vehicle starts to travel even in a case where a volume of the acoustic device is adjusted based on the noise level when the vehicle is stopped, particularly a minute volume portion of a reproduction sound is masked, and the volume may be insufficient.

JPH05-121983A discloses an on-vehicle acoustic device that can detect a noise with good correspondence to audibility and that has an automatic volume and quality adjustment function which is appropriate in terms of audibility, by detecting a noise over an entire voice band using a microphone provided in a vehicle and estimating an amount of the noise using a traveling velocity of the vehicle as a clue when an influence of a reproduction sound is large and noise detection is difficult.

SUMMARY OF INVENTION

There is a demand for an acoustic output in a vehicle with a volume and a quality that are more appropriate in terms of audibility.

An object of the present disclosure is to provide an acoustic output in a vehicle with a volume and a quality that are more appropriate in terms of audibility.

The present disclosure provides an acoustic processing device mountable on a vehicle, the acoustic processing device comprising: a memory; and a processor that is coupled to the memory, and when executing a program stored in the memory, performs operations comprising: outputting a noise level obtained by subtracting a sound source level from a microphone level; outputting a velocity noise level indicating a frequency characteristic of a noise based on a velocity of the vehicle; outputting a volume sound source level indicating a frequency characteristic based on a volume of a predetermined sound source signal; outputting an SN ratio which is a ratio between the volume sound source level and the velocity noise level; selecting one of estimated noise level candidates based on the SN ratio, the estimated noise level candidates including a level related to the noise level and the velocity noise level; and outputting a selected one of the estimated noise level candidates as an estimated noise level, wherein the microphone level indicates a frequency characteristic of a microphone signal collected by a microphone provided in the vehicle, and wherein the sound source level indicates a frequency characteristic of a sound source signal to be input to a speaker provided in the vehicle.

The present disclosure provides an acoustic processing device mountable on a vehicle, the acoustic processing device including: outputting a noise signal obtained by subtracting, using an adaptive filter, a sound source signal from a microphone signal collected by a microphone provided in the vehicle; outputting a velocity noise level indicating a frequency characteristic of a noise based on a velocity of the vehicle; outputting a volume sound source level indicating a frequency characteristic based on a volume of a predetermined sound source signal; outputting an SN ratio which is a ratio between the volume sound source level and the velocity noise level; selecting one of estimated noise level candidates based on the SN ratio, the estimated noise level candidates including a microphone level indicating a frequency characteristic of the microphone signal, a noise level indicating a frequency characteristic of the noise signal, and the velocity noise level; and outputting a selected one of the estimated noise level candidates as an estimated noise level, wherein the sound source signal is a signal to be input to a speaker provided in the vehicle.

The present disclosure provides an acoustic processing method by a device mountable on a vehicle, the acoustic processing method including: outputting a noise level obtained by subtracting a sound source level from a microphone level; outputting a velocity noise level indicating a frequency characteristic of a noise based on a velocity of the vehicle; outputting a volume sound source level indicating a frequency characteristic based on a volume of a predetermined sound source signal; outputting an SN ratio which is a ratio between the volume sound source level and the velocity noise level; and selecting one of estimated noise level candidates based on the SN ratio, the estimated noise level candidates including a level related to the noise level and the velocity noise level based on the SN ratio, and outputting a selected one of the estimated noise level candidates as an estimated noise level, wherein the microphone level indicates a frequency characteristic of a microphone signal collected by a microphone provided in the vehicle, and wherein the sound source level indicates a frequency characteristic of a sound source signal to be input to a speaker provided in the vehicle.

These comprehensive or specific aspects may be implemented by a system, a device, a method, an integrated circuit, a computer program, or a recording medium, or may be implemented by any combination of the system, the device, the method, the integrated circuit, the computer program, and the recording medium.

According to the present disclosure, it is possible to provide an acoustic output in a vehicle with a volume and a quality that are more appropriate in terms of audibility.

BRIEF DESCRIPTION OF DRAWINGS

The present disclosure will be described in detail based on the following figures, wherein.

DESCRIPTION OF EMBODIMENTS

Hereinafter, an embodiment of the present disclosure will be described in detail with reference to the drawings as appropriate. However, an unnecessarily detailed description may be omitted. For example, detailed descriptions of well-known matters and repeated descriptions of substantially the same configurations may be omitted. This is to avoid unnecessary redundancy in the following description and to facilitate understanding for those skilled in the art. The accompanying drawings and the following description are provided for those skilled in the art to fully understand the present disclosure, and are not intended to limit the subject matter described in the claims.

Present Embodiment

<Configuration of Acoustic Processing Device>

Figure 1:
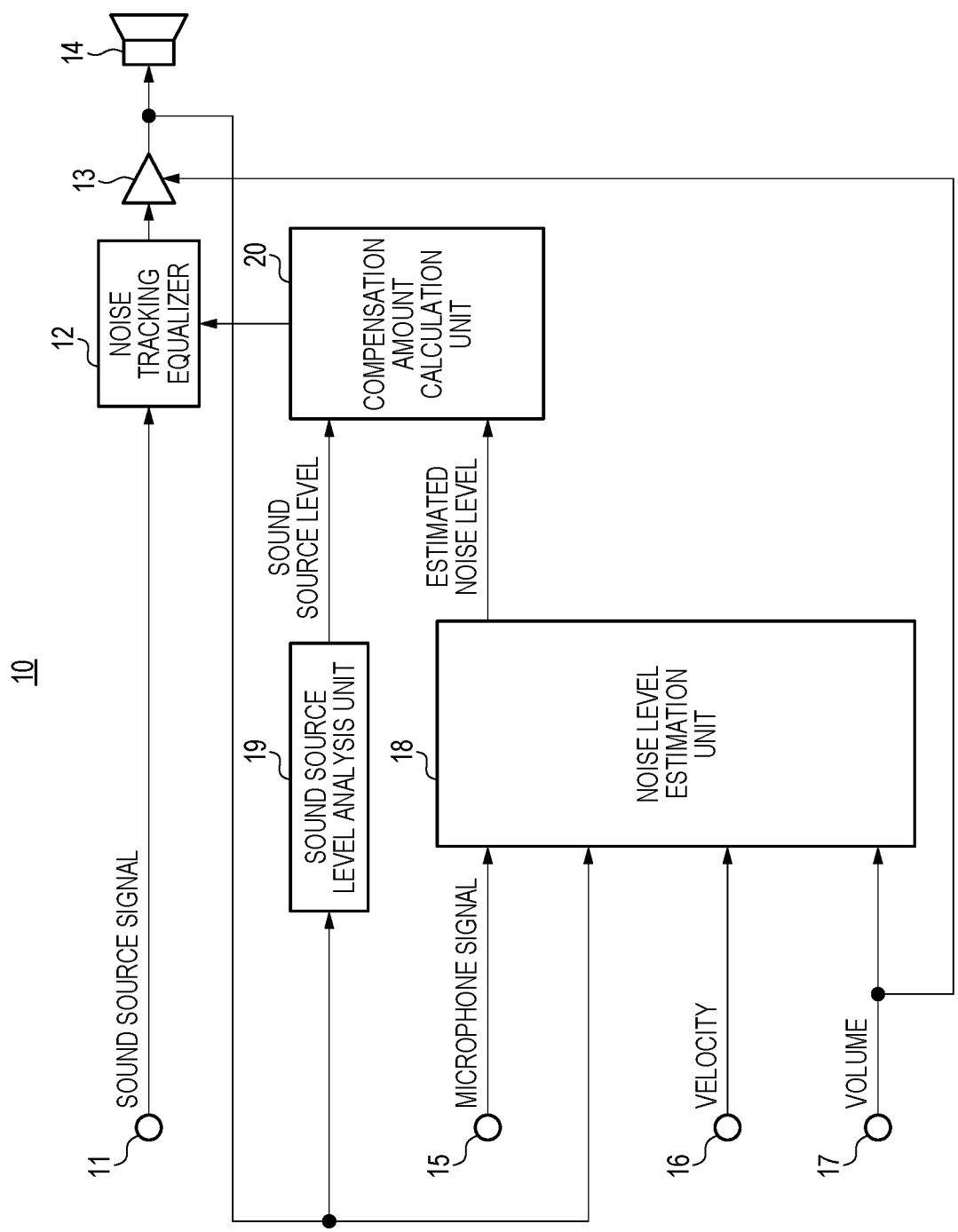
FIG. 1 is a block diagram showing a configuration example of an acoustic processing device according to the present embodiment.

FIG. 1 is a block diagram showing a configuration example of an acoustic processing device 10 according to the present embodiment.

The acoustic processing device 10 is mounted in a vehicle, and outputs, as an acoustic, a sound source signal obtained from a sound source to an inside of the vehicle. As shown in FIG. 1, the acoustic processing device 10 includes a sound source signal input unit 11, a noise tracking equalizer 12, a volume amplification unit 13, a speaker 14, a microphone signal input unit 15, a velocity input unit 16, a volume input unit 17, a noise level estimation unit 18, a sound source level analysis unit 19, and a compensation amount calculation unit 20.

A sound source signal is input to the sound source signal input unit 11. Examples of the sound source include a radio, a cassette tape, a compact disc (CD), a digital versatile disc (DVD), a Blu-ray (registered trademark) disc (BD), a USB memory, an SD card, and Internet streaming. That is, the sound source signal is a time signal of a sound reproduced from the sound source.

The noise tracking equalizer 12 adjusts a frequency characteristic of the sound source signal input to the sound source signal input unit 11 based on a compensation amount output from the compensation amount calculation unit 20 to be described later, and outputs the adjusted sound source signal. Hereinafter, the frequency characteristic of the sound source signal is referred to as a sound source level. The compensation amount indicates an amount for compensating a sound source level that is difficult to hear due to a noise generated in the vehicle due to traveling of the vehicle or the like so as to be a sound source level that is easy to hear. That is, the noise tracking equalizer 12 adjusts the sound source level that is difficult to hear due to a noise to a sound source level that is easy to hear based on the compensation amount. In addition, since the compensation amount is an amount calculated based on the noise in the vehicle, the compensation amount also changes in accordance with a change in the noise. Therefore, the noise tracking equalizer 12 can adjust the sound source level using the compensation amount so as to follow a change in noise so that the sound source level can be easily heard. Accordingly, even when a noise is generated in the vehicle, an occupant in the vehicle can easily hear the acoustic generated by reproducing the sound source.

The volume amplification unit 13 amplifies the sound source signal output from the noise tracking equalizer 12 based on a volume input to the volume input unit 17, and outputs the amplified sound source signal. The volume amplification unit 13 may also be referred to as an amplifier.

The speaker 14 is provided in the vehicle, and outputs the sound source signal output from the volume amplification unit 13 as an acoustic.

A microphone signal is input to the microphone signal input unit 15. The microphone signal is a time signal of a sound collected by a microphone provided in the vehicle. Therefore, the microphone signal may include a signal of the acoustic output from the speaker 14 to the inside of the vehicle and a signal of the noise heard in the inside of the vehicle.

A value indicating a velocity of the vehicle is input to the velocity input unit 16. The velocity of the vehicle may be automatically acquired from a vehicle velocity sensor mounted on the vehicle.

A value indicating a volume when the sound source signal is output as an acoustic from the speaker 14 is input to the volume input unit 17. The volume may be input by an occupant in the vehicle. For example, the occupant can increase or decrease the volume of the acoustic output from the speaker 14 by operating the acoustic processing device 10.

The noise level estimation unit 18 estimates a noise level indicating a frequency characteristic of the noise in the vehicle based on the microphone signal input to the microphone signal input unit 15, the sound source signal output from the volume amplification unit 13, the velocity input to the velocity input unit 16, and the volume input to the volume input unit 17, and outputs the noise level as the estimated noise level. Details of the noise level estimation unit 18 will be described later.

The sound source level analysis unit 19 analyzes the frequency characteristic of the sound source signal output from the volume amplification unit 13, and outputs a sound source level indicating the analyzed frequency characteristic. The sound source level analysis unit 19 may perform predetermined weighting on the sound source level and output the weighted sound source level.

The compensation amount calculation unit 20 calculates a compensation amount based on the sound source level output from the sound source level analysis unit 19 and the estimated noise level output from the noise level estimation unit 18, and outputs the calculated compensation amount. For example, the compensation amount calculation unit 20 calculates a compensation amount for increasing a sound source level of a frequency band in which a difference between the sound source level and the estimated noise level is less than a predetermined threshold.

The acoustic processing device 10 may include a processor, a memory, a storage, and the like. The noise tracking equalizer 12, the noise level estimation unit 18, the sound source level analysis unit 19, and the compensation amount calculation unit 20 may be implemented by the processor executing a predetermined computer program in cooperation with the memory, the storage, and the like. Alternatively, at least one of the noise tracking equalizer 12, the noise level estimation unit 18, the sound source level analysis unit 19, and the compensation amount calculation unit 20 may be implemented by an integrated circuit. Examples of the integrated circuit include a large scale integration (LSI), an application specific integrated circuit (ASIC), a programmable logic device (PLD), and a field-programmable gate array (FPGA). The predetermined program may be stored in the memory.

First Configuration Example

Figure 2:
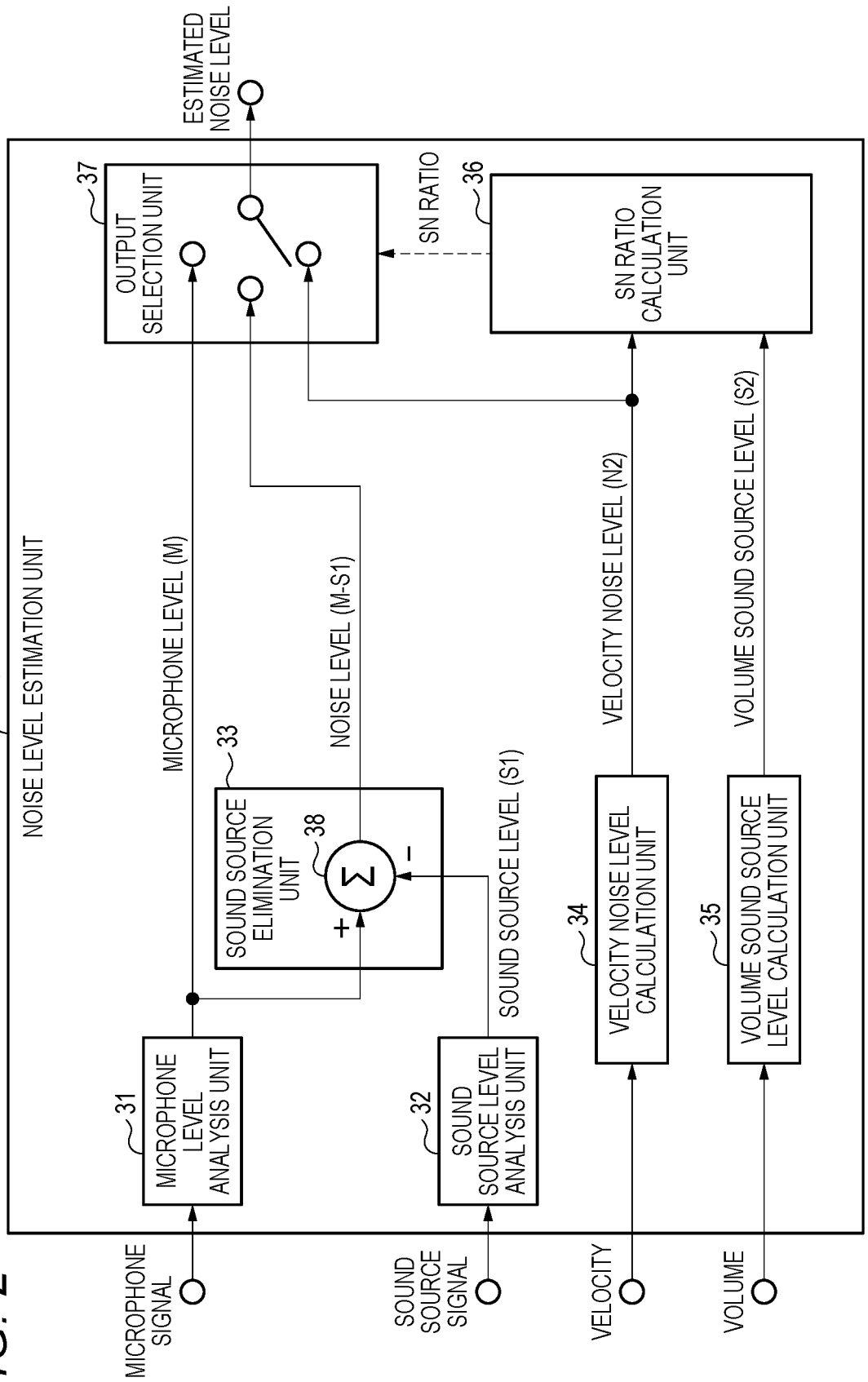
FIG. 2 is a block diagram showing a first configuration example of a noise level estimation unit according to the present embodiment.

FIG. 2 is a block diagram showing a first configuration example of the noise level estimation unit 18 according to the present embodiment.

The noise level estimation unit 18 according to the first configuration example includes a microphone level analysis unit 31, a sound source level analysis unit 32, a sound source elimination unit 33, a velocity noise level calculation unit 34, a volume sound source level calculation unit 35, an SN ratio calculation unit 36, and an output selection unit 37.

The microphone level analysis unit 31 analyzes a frequency characteristic of the microphone signal input to the microphone signal input unit 15, and outputs a microphone level indicating the analyzed frequency characteristic.

The sound source level analysis unit 32 analyzes a frequency characteristic of a sound source signal output from the volume amplification unit 13, and outputs a sound source level indicating the analyzed frequency characteristic. The sound source level analysis unit 32 may perform predetermined weighting on the sound source level and output the weighted sound source level.

The sound source elimination unit 33 calculates a noise level by eliminating the sound source level output from the sound source level analysis unit 32 from the microphone level output from the microphone level analysis unit 31. For example, the sound source elimination unit 33 includes a subtraction processing unit 38, and the subtraction processing unit 38 outputs, as a noise level (M-S1), a value obtained by subtracting a sound source level (S1) from a microphone level (M).

The velocity noise level calculation unit 34 calculates a velocity noise level based on a velocity of the vehicle input to the speed input unit 16, and outputs a calculated velocity noise level (N2). The velocity noise level indicates a frequency characteristic of a noise in the vehicle at a certain velocity. For example, a provider of the acoustic processing device 10 measures the noise level in the vehicle at each velocity, and generates in advance a velocity noise level table in which each velocity and the noise level measured at that velocity are associated with each other. Then, the provider stores the velocity noise level table in advance in a memory, a storage, or the like of the acoustic processing device 10. The velocity noise level calculation unit 34 calculates the velocity noise level corresponding to the velocity input to the speed input unit 16 using the velocity noise level table.

The volume sound source level calculation unit 35 calculates a volume sound source level based on a volume input to the volume input unit 17, and outputs a calculated volume sound source level (S2). The volume sound source level indicates a frequency characteristic at a certain volume of a predetermined sound source signal. For example, the provider of the acoustic processing device 10 measures a sound source level of a predetermined sound source signal at each volume, and generates in advance a volume sound source level table in which each volume and the sound source level measured at the volume are associated with each other. Then, the provider stores the volume sound source level table in advance in a memory, a storage, or the like of the acoustic processing device 10. The volume sound source level calculation unit 35 calculates a volume sound source level corresponding to the volume input to the volume input unit 17 using the volume sound source level table.

The SN ratio calculation unit 36 calculates, as an SN ratio, a ratio between the volume sound source level (S2) output from the volume sound source level calculation unit 35 and the velocity noise level (N2) output from the velocity noise level calculation unit 34, and outputs the calculated SN ratio.

The output selection unit 37 selects one of the microphone level (M) output from the microphone level analysis unit 31, the noise level (M-S1) output from the sound source elimination unit 33, and the velocity noise level (N2) output from the velocity noise level calculation unit 34 based on the SN ratio output from the SN ratio calculation unit 36, and outputs the selected level as an estimated noise level. For example, the output selection unit 37 performs the following selection (A1) to (A3).

(A1) When the SN ratio is smaller than a predetermined threshold Th0, the output selection unit 37 selects the microphone level (M) and outputs the microphone level (M) as an estimated noise level.

(A2) When the SN ratio is larger than a predetermined threshold Th1, the output selection unit 37 selects the velocity noise level (N2) and outputs the velocity noise level (N2) as an estimated noise level. The threshold Th1 is larger than the threshold Th0.

(A3) When the SN ratio satisfies neither the condition in (A1) nor the condition in (A2), the output selection unit 37 selects the noise level (M-S1) and outputs the noise level (M-S1) as an estimated noise level. That is, when the SN ratio is equal to or larger than the threshold Th0 and also equal to or smaller than the threshold Th1, the output selection unit 37 selects the noise level (M-S1) and outputs the noise level (M-S1) as an estimated noise level.

The microphone level may be included in a level related to the microphone level. The noise level may be included in a level related to the noise level. The level related to the microphone level, the level related to the noise level, and the velocity noise level may be included in estimated noise level candidates.

Next, a reason why the output selection unit 37 performs the selection as in (A1) to (A3) in the present embodiment will be described.

The noise level (M-S1) shown in the above (A3) is calculated by subtracting the sound source level (S1) from the microphone level (M) on the assumption that an energy addition is established between the sound source signal and the noise signal. Here, the fact that an energy addition is established between the sound source signal and the noise signal means that the microphone signal is indicated by simply adding the sound source signal and the noise signal. However, when the sound source signal is sufficiently larger than the noise signal, a simple energy addition is not established between the sound source signal and the noise signal. Therefore, in this case, the noise level (M-S1) calculated by subtracting the sound source level (S1) from the microphone level (M) may include a large error from an actual noise level. When the compensation amount calculation unit 20 calculates a compensation amount using the noise level (M-S1) including a large error, a compensation amount greatly deviated from an actual noise level is calculated. When the noise tracking equalizer 12 adjusts the sound source level using a compensation amount greatly deviated from an actual noise level, there is a problem that, for example, the sound source level is unnecessarily increased, and an acoustic is output with a volume and a quality which are not appropriate in terms of audibility.

On the other hand, in the present embodiment, when the sound source signal is sufficiently larger than the noise signal, that is, when the SN ratio is larger than the predetermined threshold Th1, the output selection unit 37 selects and outputs the velocity noise level (N2) as described in the above (A2). Therefore, when the sound source signal is sufficiently larger than the noise signal, the compensation amount calculation unit 20 calculates a compensation amount using the velocity noise level (N2), and therefore, there is a problem that an acoustic is output with a volume and a quality which are not appropriate in terms of audibility as in a case of using the noise level (M-S1).

A reason why the output selection unit 37 performs the selection described in the above (A1) when the sound source signal is sufficiently smaller than the noise signal, that is, when the SN ratio is smaller than the predetermined threshold Th0 is as follows. That is, when the SN ratio is smaller than the predetermined threshold Th0, the noise component is dominant in the microphone level (M), and therefore, it can be estimated that the frequency characteristic of the noise in the vehicle is appropriately represented.

According to the first configuration example, the noise level estimation unit 18 can provide the compensation amount calculation unit 20 with an estimated noise level that more appropriately expresses a noise in the vehicle. Therefore, the acoustic processing device can appropriately adjust a sound source signal that is difficult to hear due to a noise in the vehicle to a sound source signal that is easy to hear, and output the sound source signal as an acoustic from the speaker 14. That is, the acoustic processing device 10 can provide an acoustic output with a volume and a quality that are more appropriate in terms of audibility with respect to a noise in the vehicle.

Second Configuration Example

Figure 3:
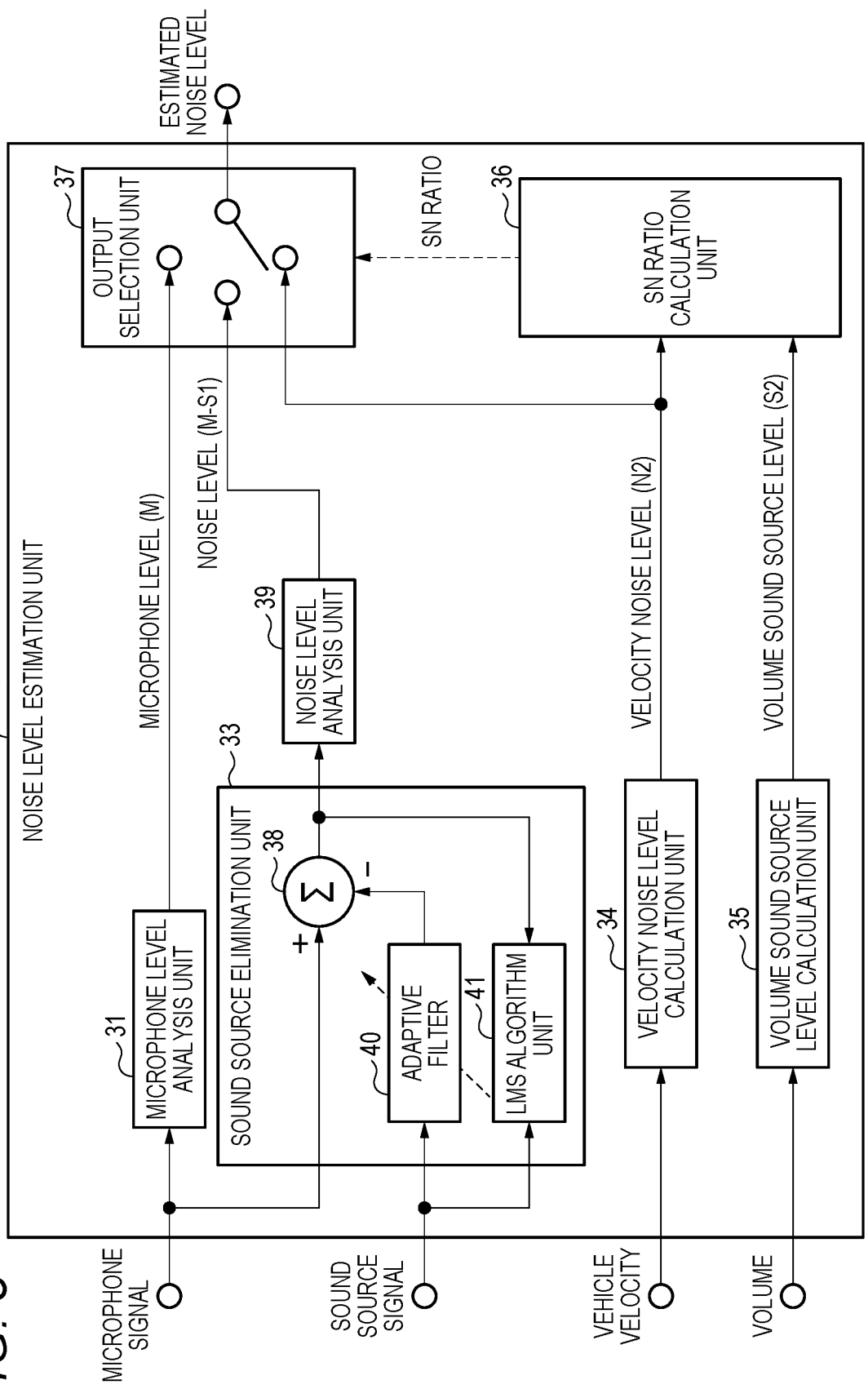
FIG. 3 is a block diagram showing a second configuration example of the noise level estimation unit according to the present embodiment.

FIG. 3 is a block diagram showing a second configuration example of the noise level estimation unit 18 according to the present embodiment.

The noise level estimation unit 18 according to the second configuration example includes the microphone level analysis unit 31, the sound source elimination unit 33, the velocity noise level calculation unit 34, the volume sound source level calculation unit 35, the SN ratio calculation unit 36, the output selection unit 37, and a noise level analysis unit 39.

The microphone level analysis unit 31, the velocity noise level calculation unit 34, the volume sound source level calculation unit 35, and the SN ratio calculation unit 36 perform the same processing as those in the first configuration example.

The sound source elimination unit 33 includes the subtraction processing unit 38, an adaptive filter 40, and a least mean squares (LMS) algorithm unit 41.

The adaptive filter 40 performs, on the sound source signal output from the volume amplification unit 13, a variable filter based on a correction coefficient output from the LMS algorithm unit 41, and outputs the sound source signal to which the variable filter is applied.

The subtraction processing unit 38 outputs a noise signal obtained by subtracting the sound source signal output from the adaptive filter 40 from the microphone signal input to the microphone signal input unit 15.

The LMS algorithm unit 41 calculates a correction coefficient by an LMS algorithm based on the sound source signal output from the volume amplification unit 13 and the noise signal output from the subtraction processing unit 38, and outputs the correction coefficient to the adaptive filter 40. A method for calculating a correction coefficient is not limited to the LMS algorithm, and other adaptive algorithms may be used.

The noise level analysis unit 39 analyzes a frequency characteristic of the noise signal output from the subtraction processing unit 38, and outputs the noise level (M-S1) indicating the analyzed frequency characteristic.

The output selection unit 37 selects one of the microphone level (M) output from the microphone level analysis unit 31, the noise level (M-S1) output from the noise level analysis unit 39, and the velocity noise level (N2) output from the velocity noise level calculation unit 34 based on an SN ratio output from the SN ratio calculation unit 36, and outputs the selected level as an estimated noise level. The output selection unit 37 may perform the selection by (A1) to (A3) described in the first configuration example.

According to the second configuration example, the noise level estimation unit 18 can provide the compensation amount calculation unit 20 with an estimated noise level that more appropriately expresses a noise in the vehicle. Therefore, the acoustic processing device can adjust a sound source signal that is difficult to hear due to a noise in the vehicle to a sound source signal that is easy to hear, and output the sound source signal as an acoustic from the speaker 14.

When the noise signal is sufficiently larger than the sound source signal or when the sound source signal is sufficiently smaller than the noise signal, elimination performance of the adaptive filter 40 on the sound source signal may be reduced. In this case, the sound source elimination unit 33 may not use the adaptive filter 40 when the elimination performance may be reduced, and may use the adaptive filter 40 when the elimination performance is considered not to be reduced. Accordingly, an error in the noise signal output from the sound source elimination unit 33 is reduced, and therefore, the acoustic processing device 10 can provide an acoustic output with a volume and a quality that are more appropriate in terms of audibility.

Third Configuration Example

Figure 4:
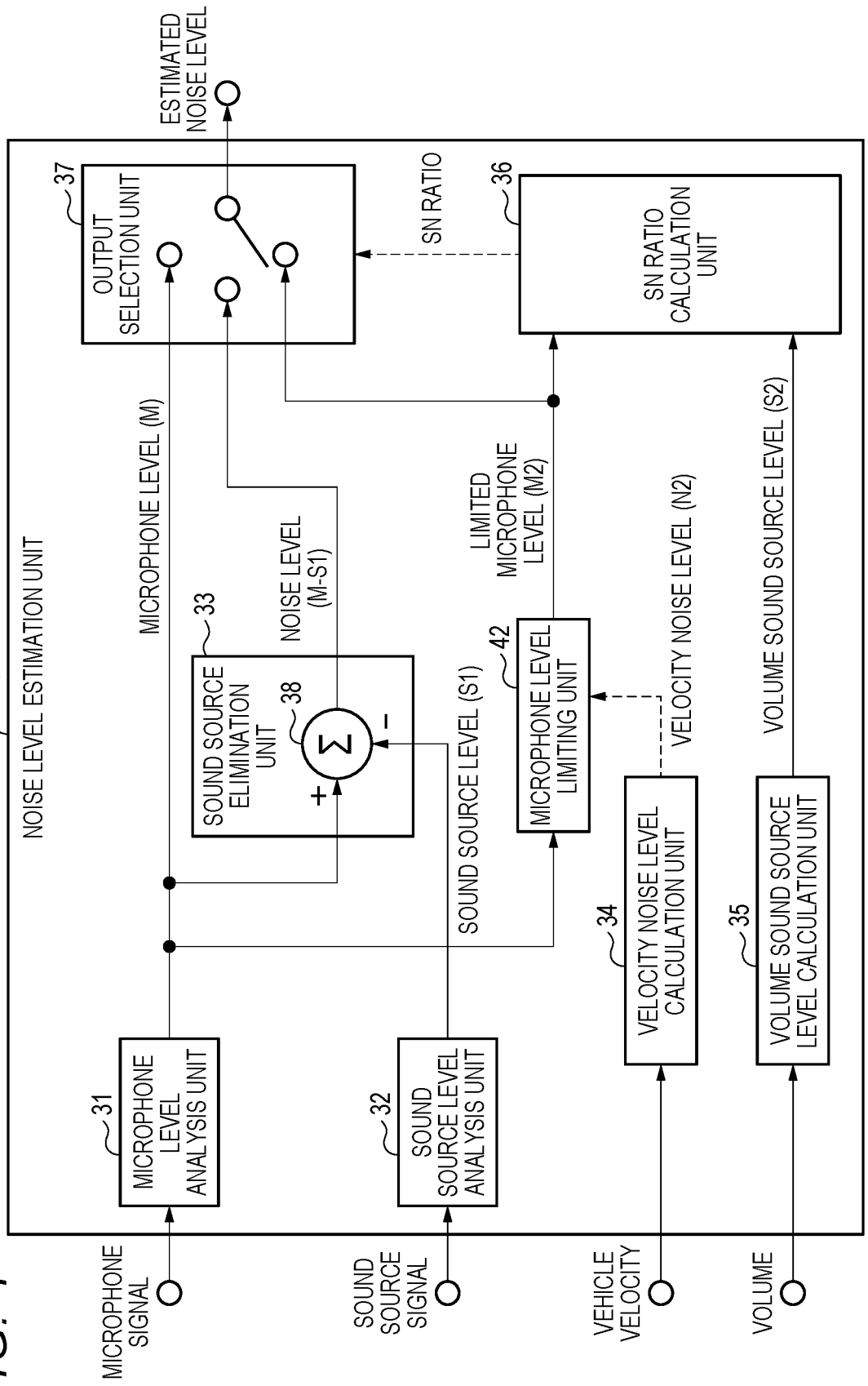
FIG. 4 is a block diagram showing a third configuration example of the noise level estimation unit according to the present embodiment.

FIG. 4 is a block diagram showing a third configuration example of the noise level estimation unit 18 according to the present embodiment.

The noise level estimation unit 18 according to the third configuration example includes the microphone level analysis unit 31, the sound source level analysis unit 32, the sound source elimination unit 33, the velocity noise level calculation unit 34, the volume sound source level calculation unit 35, the SN ratio calculation unit 36, the output selection unit 37, and a microphone level limiting unit 42.

The microphone level analysis unit 31, the sound source level analysis unit 32, the sound source elimination unit 33, the volume sound source level calculation unit 35, and the velocity noise level calculation unit 34 perform the same processing as those in the first configuration example.

The microphone level limiting unit 42 limits an upper limit and a lower limit of the microphone level (M) output from the microphone level analysis unit 31 based on the velocity noise level (N2) output from the velocity noise level calculation unit 34, and outputs, as a limited microphone level (M2), the microphone level which has been limited. For example, the microphone level limiting unit 42 performs the following processing (B1) to (B3).

(B1) When the microphone level (M) is higher than a level obtained by adding a predetermined value Max1 to the velocity noise level (N2), the microphone level limiting unit 42 outputs the level obtained by adding the predetermined value Max1 to the velocity noise level (N2) as the limited microphone level (M2).

(B2) When the microphone level (M) is lower than a level obtained by subtracting a predetermined value Min1 from the velocity noise level (N2), the microphone level limiting unit 42 outputs the level obtained by subtracting the predetermined value Min1 from the velocity noise level (N2) as the limited microphone level (M2).

(B3) When the microphone level (M) satisfies neither the condition in (B1) nor the condition in (B2), the microphone level limiting unit 42 outputs the microphone level (M) as it is as the limited microphone level (M2). That is, when the microphone level (M) is equal to or lower than the level obtained by adding the predetermined value Max1 to the velocity noise level (N2) and also equal to or higher than the level obtained by subtracting the predetermined value Min1 from the velocity noise level (N2), the microphone level limiting unit 42 outputs the microphone level (M) as it is as the limited microphone level (M2).

The SN ratio calculation unit 36 calculates a ratio between the volume sound source level (S2) output from the volume sound source level calculation unit 35 and the limited microphone level (M2) output from the microphone level limiting unit 42, and outputs the calculated ratio as an SN ratio.

The output selection unit 37 selects one of the microphone level (M) output from the microphone level analysis unit 31, the noise level (M-S1) output from the sound source elimination unit 33, and the limited microphone level (M2) output from the microphone level limiting unit 42 based on the SN ratio output from the SN ratio calculation unit 36, and outputs the selected level as an estimated noise level. For example, the output selection unit 37 performs the following selection (C1) to (C3).

(C1) When the SN ratio is smaller than the predetermined threshold Th0, the output selection unit 37 selects the microphone level (M) and outputs the microphone level (M) as the estimated noise level.

(C2) When the SN ratio is larger than the predetermined threshold Th1, the output selection unit 37 selects the limited microphone level (M2) and outputs the limited microphone level (M2) as the estimated noise level. The threshold Th1 is larger than the threshold Th0.

(C3) When the SN ratio satisfies neither the condition in (C1) nor the condition in (C2), the output selection unit 37 selects the noise level (M-S1) and outputs the noise level (M-S1) as the estimated noise level. That is, when the SN ratio is equal to or larger than the threshold Th0 and also equal to or smaller than the threshold Th1, the output selection unit 37 selects the noise level (M-S1) and outputs the selected noise level (M-S1) as the estimated noise level.

When a compensation amount is calculated using the velocity noise level (N2) as the estimated noise level as in the first configuration example, a change in noise caused by a difference in road surface on which the vehicle is traveling is not reflected in the compensation amount. On the other hand, the microphone level also includes a noise component that changes due to the difference in road surface. Therefore, it is possible to reflect the change in noise caused by the difference in road surface in the compensation amount by calculating the compensation amount using the microphone level as the estimated noise level. On the other hand, the microphone level may include a sudden noise. Examples of the sudden noise include a sound generated when an occupant touches a microphone, a sudden loud voice of an occupant, and a sound generated when the vehicle moves over a step. When a compensation amount is calculated using the microphone level including such a sudden noise as it is as an estimated noise level and the noise tracking equalizer 12 adjusts the sound source level using the compensation amount calculated in this way, there is a problem that, for example, the sound source level is unnecessarily increased. Therefore, in the third configuration example, as described above, the microphone level limiting unit 42 is provided, and when the SN ratio is larger than the threshold Th1 as shown in (C2), the limited microphone level (M2) is selected and output, thereby preventing the occurrence of such a problem.

The SN ratio calculation unit 36 may calculate an SN ratio using the sound source level (S1) output from the sound source level analysis unit 32 instead of the volume sound source level (S2). Accordingly, even in a case of a sound source having a small recording level such as a CD sound source, for example, the SN ratio can be calculated at an appropriate sound source level (S1). In this case, the noise level estimation unit 18 may limit an upper limit and a lower limit of the sound source level (S1) output from the sound source level analysis unit 32 based on the volume sound source level (S2) output from the volume sound source level calculation unit 35, and output the limited sound source level to the SN ratio calculation unit 36. Accordingly, for example, even when the sound source level (S1) rapidly fluctuates, or even when an unnecessary noise is included in an analog sound source signal, a stable SN ratio can be obtained.

Fourth Configuration Example

Figure 5:
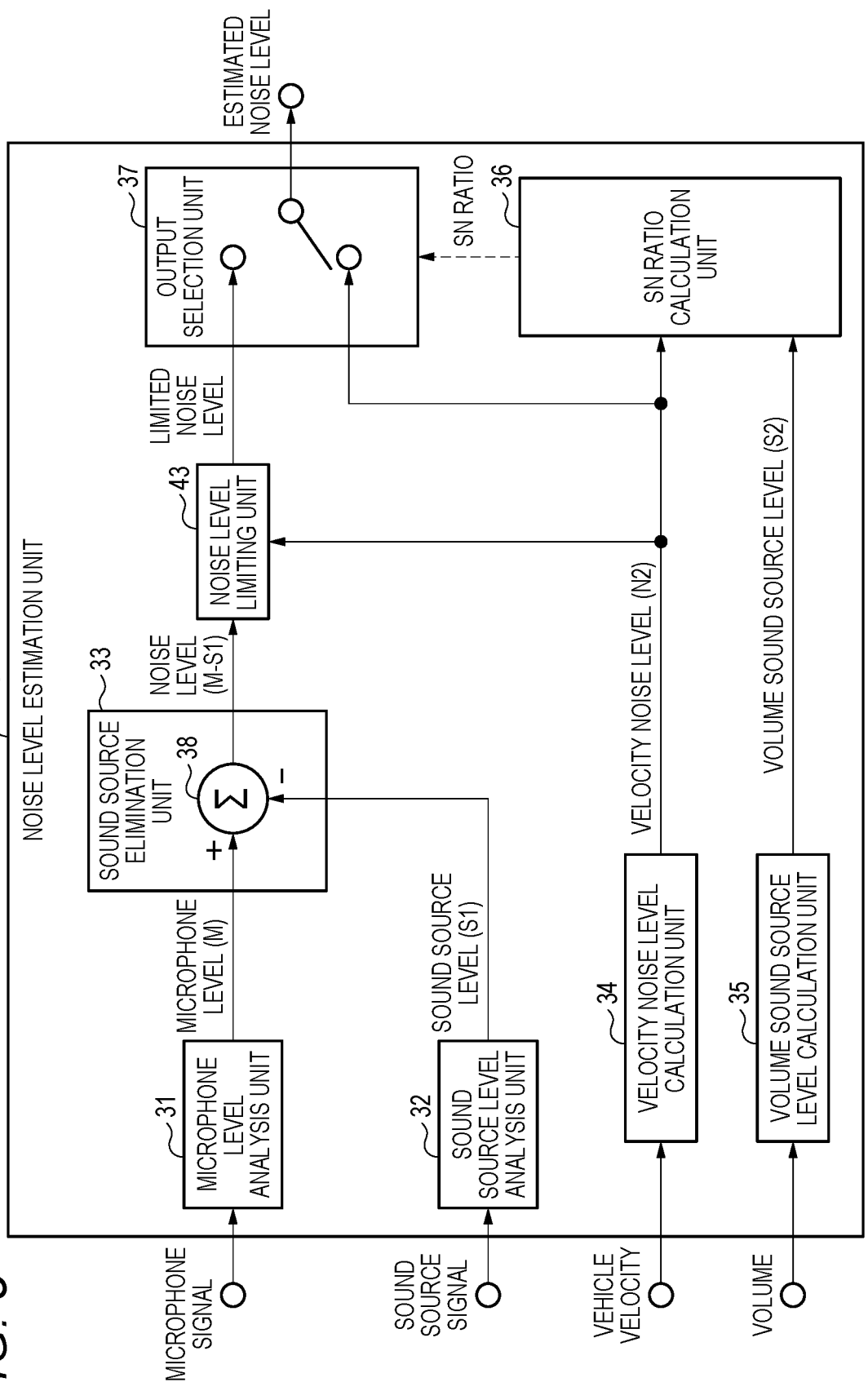
FIG. 5 is a block diagram showing a fourth configuration example of the noise level estimation unit according to the present embodiment.

FIG. 5 is a block diagram showing a fourth configuration example of the noise level estimation unit 18 according to the present embodiment.

The noise level estimation unit 18 according to the fourth configuration example includes the microphone level analysis unit 31, the sound source level analysis unit 32, the sound source elimination unit 33, the velocity noise level calculation unit 34, the volume sound source level calculation unit 35, the SN ratio calculation unit 36, the output selection unit 37, and a noise level limiting unit 43.

The microphone level analysis unit 31, the sound source level analysis unit 32, the sound source elimination unit 33, the velocity noise level calculation unit 34, the volume sound source level calculation unit 35, and the SN ratio calculation unit 36 perform the same processing as those in the first configuration example.

The noise level limiting unit 43 limits an upper limit and a lower limit of the noise level (M-S1) output from the sound source elimination unit 33 based on the velocity noise level (N2) output from the velocity noise level calculation unit 34, and outputs, as a limited noise level, the noise level which has been limited. For example, the noise level limiting unit 43 performs the following processing (D1) to (D3).

(D1) When the noise level (M-S1) is higher than a level obtained by adding a predetermined value Max2 to the velocity noise level (N2), the noise level limiting unit 43 outputs the level obtained by adding the predetermined value Max2 to the velocity noise level (N2) as a limited noise level.

(D2) When the noise level (M-S1) is lower than a level obtained by subtracting a predetermined value Min2 from the velocity noise level (N2), the noise level limiting unit 43 outputs the level obtained by subtracting the predetermined value Min2 from the velocity noise level (N2) as a limited noise level.

(D3) When the noise level (M-S1) satisfies neither the condition in the (D1) nor the condition in the above (D2), the noise level limiting unit 43 outputs the noise level (M-S1) as it is as a limited noise level. That is, when the noise level (M-S1) is equal to or lower than the level obtained by adding the predetermined value Max2 to the velocity noise level (N2) and also equal to or higher than the level obtained by subtracting the predetermined value Min2 from the velocity noise level (N2), the noise level limiting unit 43 outputs the noise level (M-S1) as it is as a limited noise level.

The limited noise level may be included in a level related to the noise level. The level related to the noise level and the velocity noise level may be included in estimated noise level candidates.

The output selection unit 37 selects one of the limited noise level output from the noise level limitation unit 43 and the velocity noise level (N2) output from the velocity noise level calculation unit 34 based on the SN ratio output from the SN ratio calculation unit 36, and outputs the selected level as an estimated noise level. For example, the output selection unit 37 performs the following selection (E1) to (E2).

(E1) When the SN ratio is equal to or smaller than the predetermined threshold Th2, the output selection unit 37 selects the limited noise level and outputs the limited noise level as the estimated noise level.

(E2) When the SN ratio is larger than the predetermined threshold Th2, the output selection unit 37 selects the velocity noise level (N2) and outputs the velocity noise level (N2) as the estimated noise level.

Figure 6:
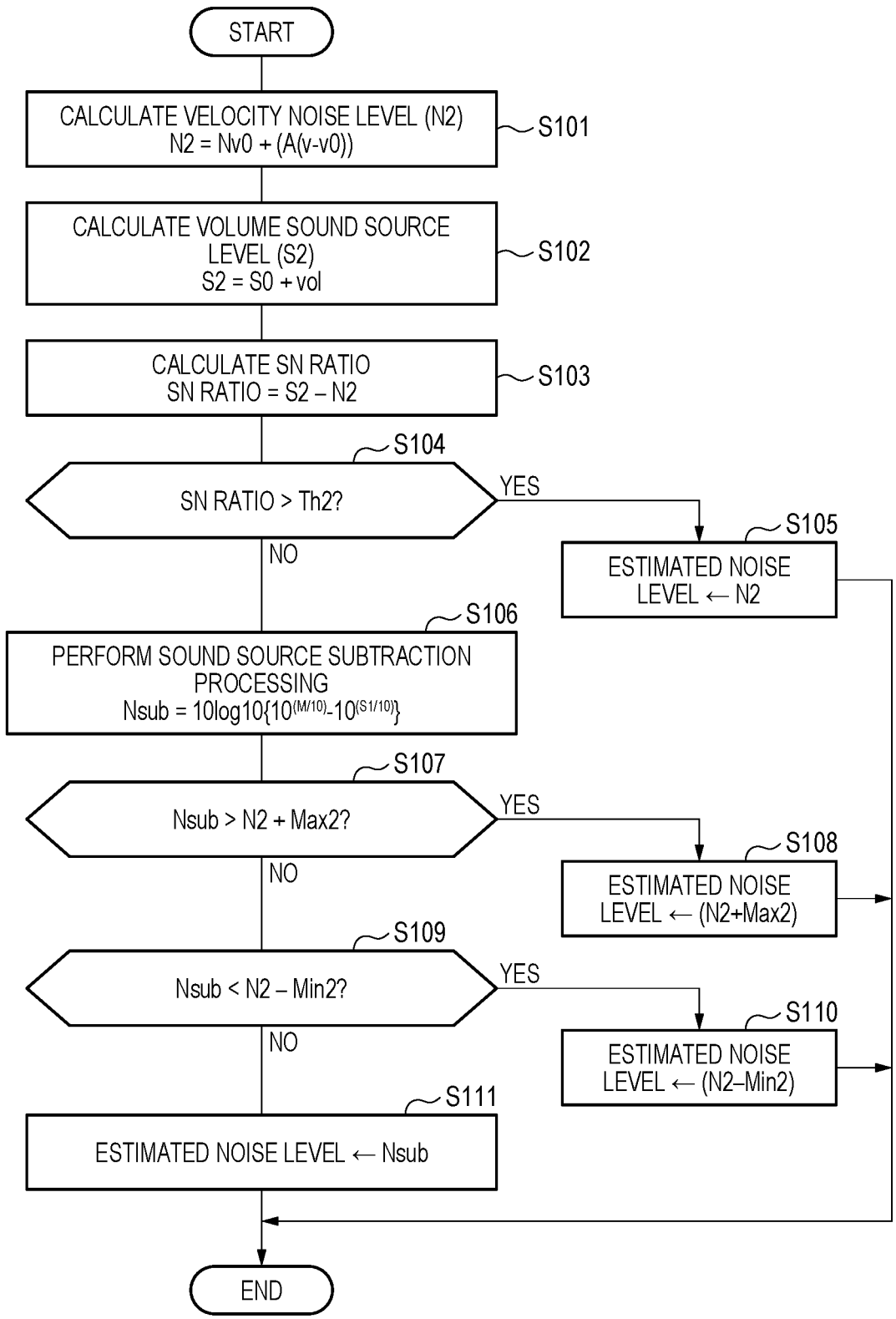
FIG. 6 is a flowchart showing an example of processing performed by the noise level estimation unit according to the fourth configuration example.

FIG. 6 is a flowchart showing an example of processing performed by the noise level estimation unit 18 according to the fourth configuration example.

The noise level estimation unit 18 calculates the velocity noise level (N2) by the following Equation (1) (S101).

$$N2 = Nv0 + (A(v-v0)) \quad (1)$$

where,
v0 indicates a reference velocity;
v indicates a current velocity of the vehicle;
Nv0 indicates a reference velocity noise level at the reference velocity v0; and
A indicates an amount of change in velocity noise level per unit velocity.

The noise level estimation unit 18 calculates the volume sound source level (S2) by the following Equation (2) (S102).

$$S2 = S0 + vol \quad (2)$$

where,
vol indicates a current volume; and
S0 indicates a sound source level at a position of the microphone when the volume vol is 0.

The noise level estimation unit 18 calculates an SN ratio between the volume sound source level (S2) and the velocity noise level (N2) by the following Equation (3) (S103).

$$(SN \text{ Ratio}) = S2 - N2 \quad (3)$$

where, in the present embodiment, S2 and N2 are indicated by a unit using a common logarithm. Therefore, the SN ratio is calculated by performing the subtraction shown in the above equation. When S2 and N2 are indicated without using the common logarithm, the SN ratio is calculated by dividing N2 from S2.

The noise level estimation unit 18 determines whether SN ratio>threshold Th2 is satisfied (S104).

When SN ratio>threshold Th2 is satisfied (S104: YES), the noise level estimation unit 18 outputs the velocity noise level (N2) as an estimated noise level (S105). Then, the noise level estimation unit 18 ends the present processing.

When SN ratio≤threshold Th2 is satisfied (S104: NO), the noise level estimation unit 18 calculates a noise level Nsub by the following Equation (4) (S106). Nsub corresponds to the above noise level (M-S1).

$$\text{Nsub} = 10 \log 10\{10^{(M/10)} - 10^{(S1/10)}\} \quad (4)$$

where,
M indicates a microphone level; and
S1 indicates a sound source level.

The noise level estimation unit 18 determines whether Nsub>(N2+Max2) is satisfied (S107).

When Nsub>(N2+Max2) is satisfied (S107: YES), the noise level estimation unit 18 outputs the limited noise level (N2+Max2) as an estimated noise level (S108). Then, the noise level estimation unit 18 ends the present processing.

When Nsub≤(N2+Max2) is satisfied (S107: NO), the noise level estimation unit 18 determines whether Nsub<(N2−Min2) is satisfied (S109).

When Nsub<(N2−Min2) is satisfied (S109: YES), the noise level estimation unit 18 outputs the limited noise level (N2-Min2) as an estimated noise level (S110). Then, the noise level estimation unit 18 ends the present processing.

When Nsub≥(N2−Min2) is satisfied (S109: NO), the noise level estimation unit 18 outputs the limited noise level (in this case, the noise level (Nsub)) as an estimated noise level (S111). That is, the noise level (Nsub) that is not limited by the noise level limiting unit 43 is output as it is as an estimated noise level. Then, the noise level estimation unit 18 ends the present processing.

Next, an error between an actually measured noise level and an estimated noise level with respect to the SN ratio between the sound source level and the noise level will be described with reference to FIGS. 7A, 7B, 7C, and 7D.

Figure 7A:
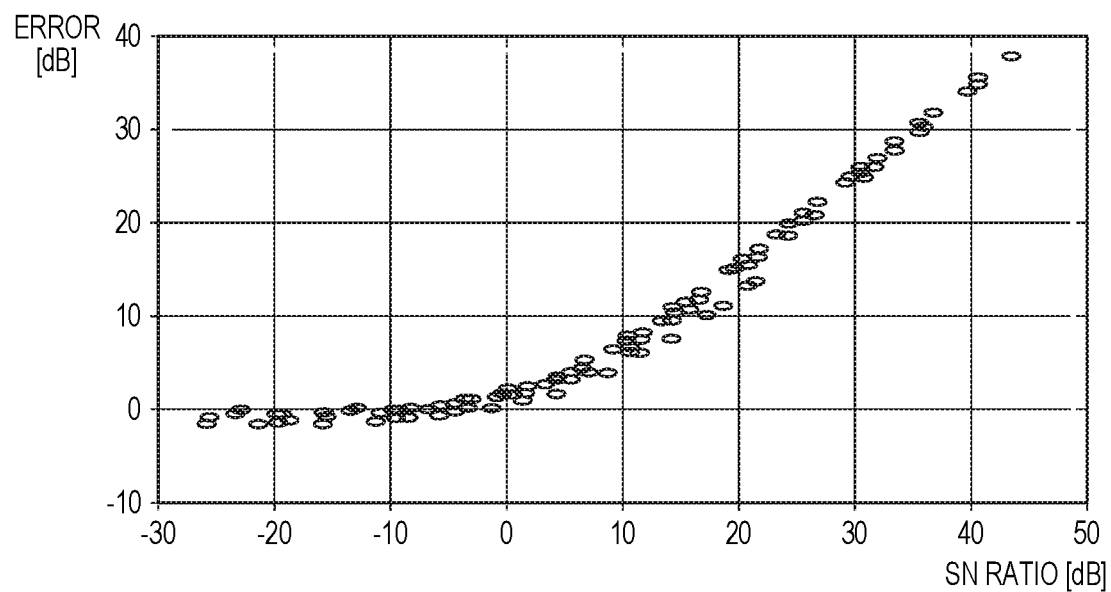
FIG. 7A is a graph in which an SN ratio calculated using a microphone level as an estimated noise level is plotted on a horizontal axis.
Figure 7B:
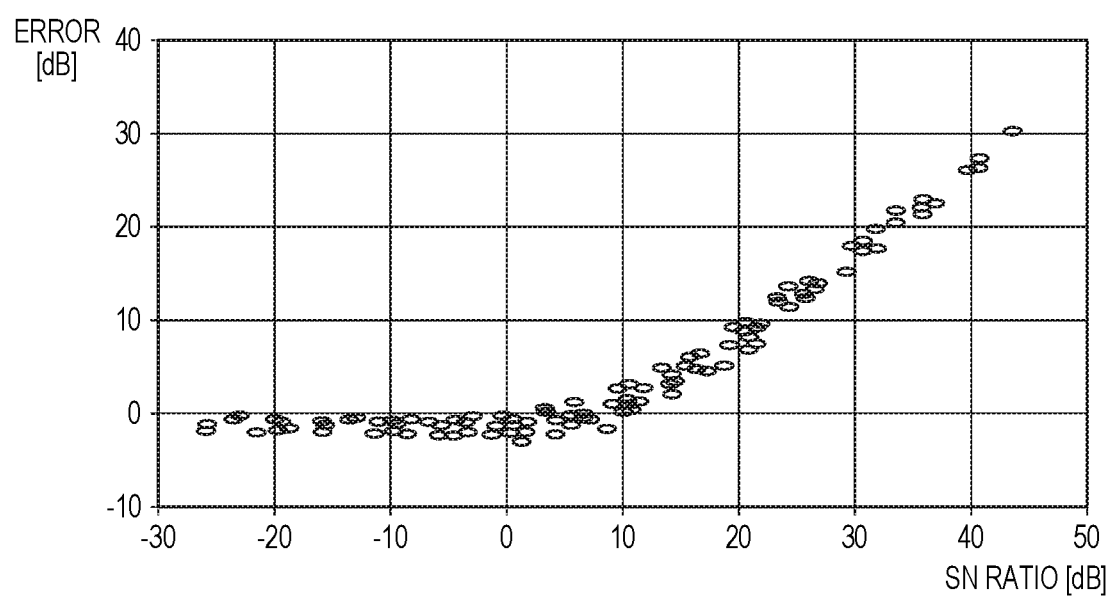
FIG. 7B is a graph showing an error in which an SN ratio calculated using a noise level output from a sound source elimination unit as an estimated noise level is plotted on a horizontal axis.
Figure 7C:
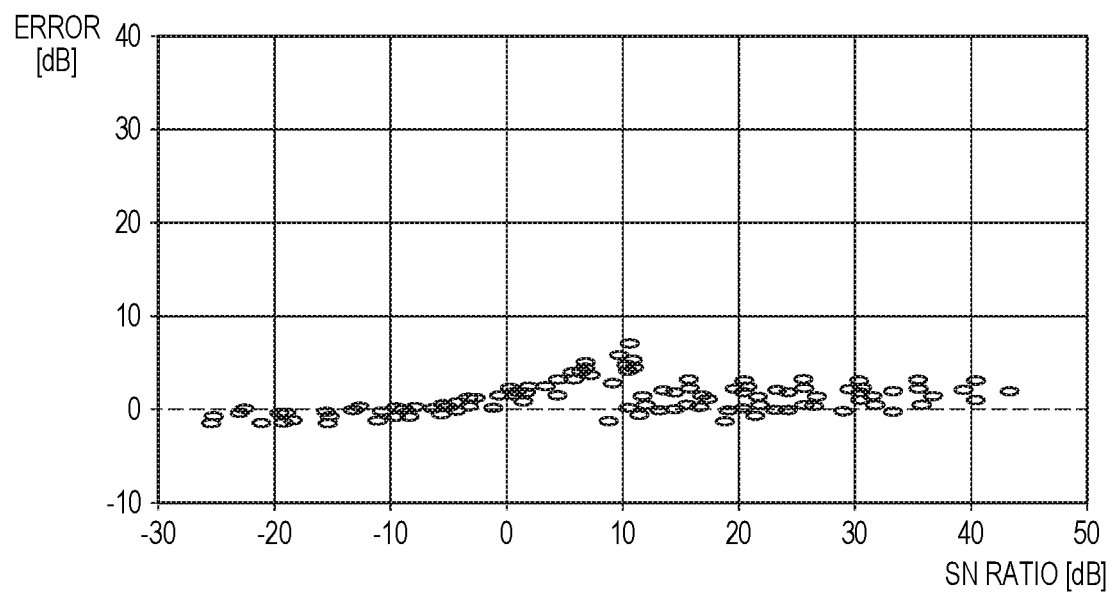
FIG. 7C is a graph in which an SN ratio calculated using a microphone level as an estimated noise level when the SN ratio is equal to or smaller than a threshold Th2 and using a velocity noise level as an estimated noise level when the SN ratio is larger than the threshold Th2 is plotted on a horizontal axis.
Figure 7D:
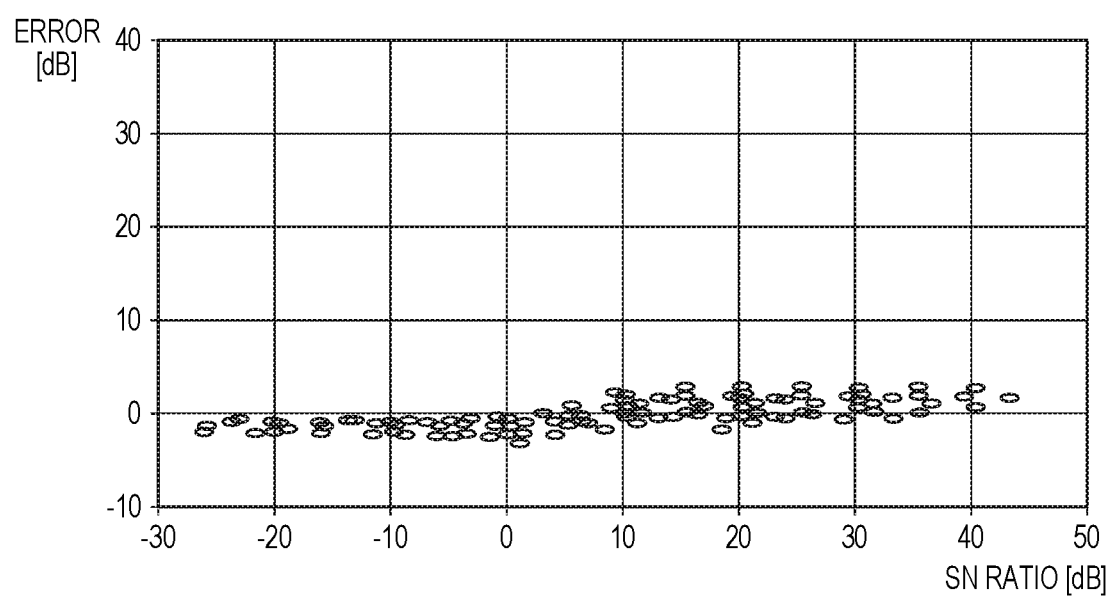
FIG. 7D is a graph in which an SN ratio calculated using a noise level output from a sound source elimination unit as an estimated noise level when the SN ratio is equal to or smaller than the threshold Th2 and using a velocity noise level as an estimated noise level when the SN ratio is larger than the threshold Th2 is plotted on a horizontal axis.

FIG. 7A is a graph in which an SN ratio calculated using a microphone level as an estimated noise level is plotted on a horizontal axis. FIG. 7B is a graph in which an SN ratio calculated using a noise level output from the sound source elimination unit 33 as an estimated noise level is plotted on a horizontal axis. FIG. 7C is a graph in which an SN ratio calculated using a microphone level as an estimated noise level when the SN ratio is equal to or smaller than the threshold Th2 and using a velocity noise level as an estimated noise level when the SN ratio is larger than the threshold Th2 is plotted on a horizontal axis. FIG. 7D is a graph in which an SN ratio calculated using a noise level output from the sound source elimination unit 33 as an estimated noise level when the SN ratio is equal to or smaller than the threshold Th2 and using a velocity noise level as an estimated noise level when the SN ratio is larger than the threshold Th2 is plotted on a horizontal axis. In the graphs in FIGS. 7A, 7B, 7C, and 7D, the horizontal axis indicates an SN ratio [dB], and a vertical axis indicates an error [dB] between an actually measured noise level and an estimated noise level.

When the microphone level is used as it is as an estimated noise level, an error between an actually measured noise level and an estimated noise level increases as the SN ratio increases as shown in the graph in FIG. 7A. The reason is that a proportion of a component of the sound source at the microphone level increases as the SN ratio increases.

When the noise level output from the sound source elimination unit 33 is used as it is as an estimated noise level, there is almost no error at the SN ratio of 0 dB or smaller as shown in the graph in FIG. 7B, but at the SN ratio of 0 dB or larger, the error increases as the SN ratio increases. The reason is that as the SN ratio increases, a simple energy addition is not established between the sound source signal and the noise signal as described above.

When the microphone level is used as an estimated noise level in a case where the SN ratio is equal to or smaller than the threshold Th2 and the velocity noise level is used as an estimated noise level in a case where the SN ratio is larger than the threshold Th2, as shown in the graph in FIG. 7C, for example, the error becomes small in a range in which the SN ratio is larger than 10 dB in comparison with FIG. 7A and FIG. 7B. However, when the SN ratio is in the vicinity of 10 dB, the error is slightly large.

On the other hand, as in the fourth configuration example, when the noise level output from the sound source elimination unit 33 is used as an estimated noise level in a case where the SN ratio is equal to or smaller than the threshold Th2 and the velocity noise level is used as an estimated noise level in a case where the SN ratio is larger than the threshold Th2, as shown in the graph in FIG. 7D, for example, the error becomes sufficiently small in a case where the SN ratio is in the vicinity of 10 dB in comparison with FIG. 7C. That is, by adopting the fourth configuration example shown in FIG. 5, the noise level estimation unit 18 can output an estimated noise level having a small error from an actually measured noise level in a wide range of SN ratio as shown in FIG. 7D.

Figure 8A:
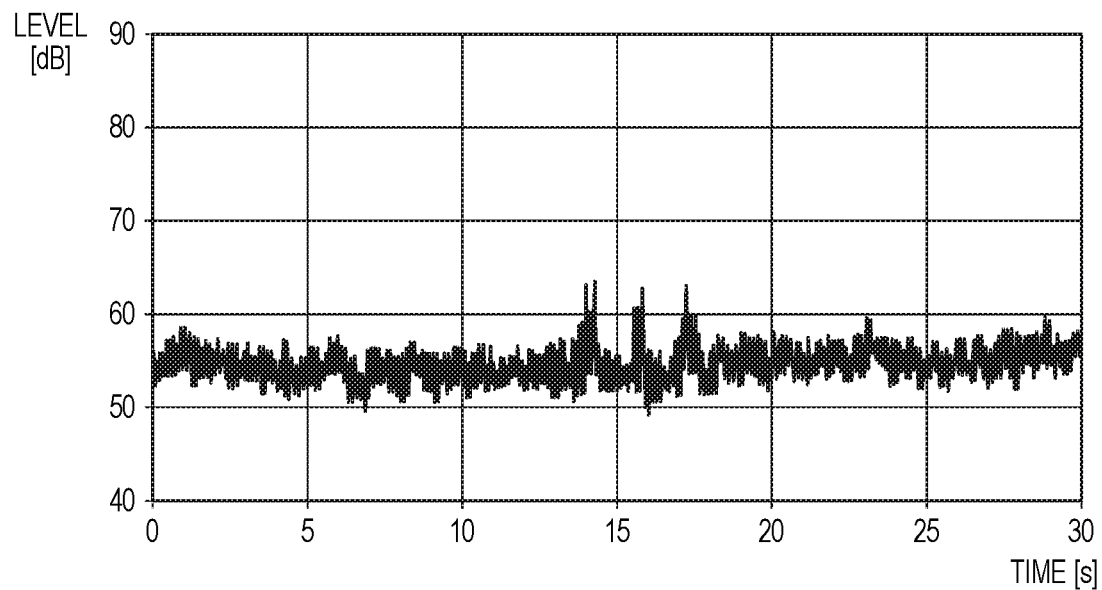
FIG. 8A is a graph showing a temporal change of an estimated noise level when a sudden noise is not input to a microphone.
Figure 8B:
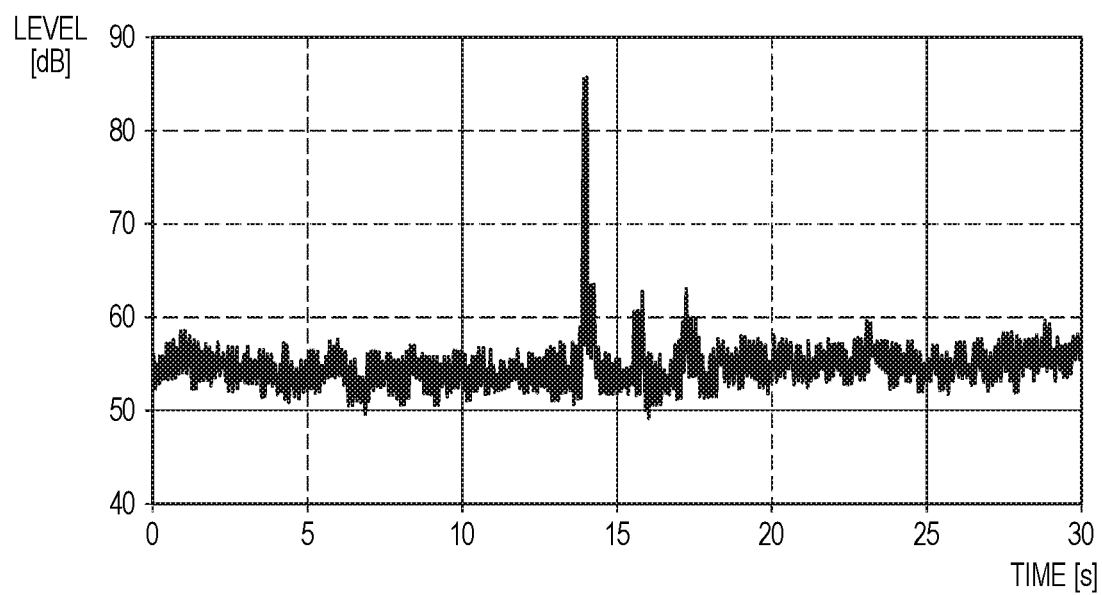
FIG. 8B is a graph showing a temporal change of an estimated noise level when a noise level limiting unit is not provided and a sudden noise is input to a microphone.
Figure 8C:
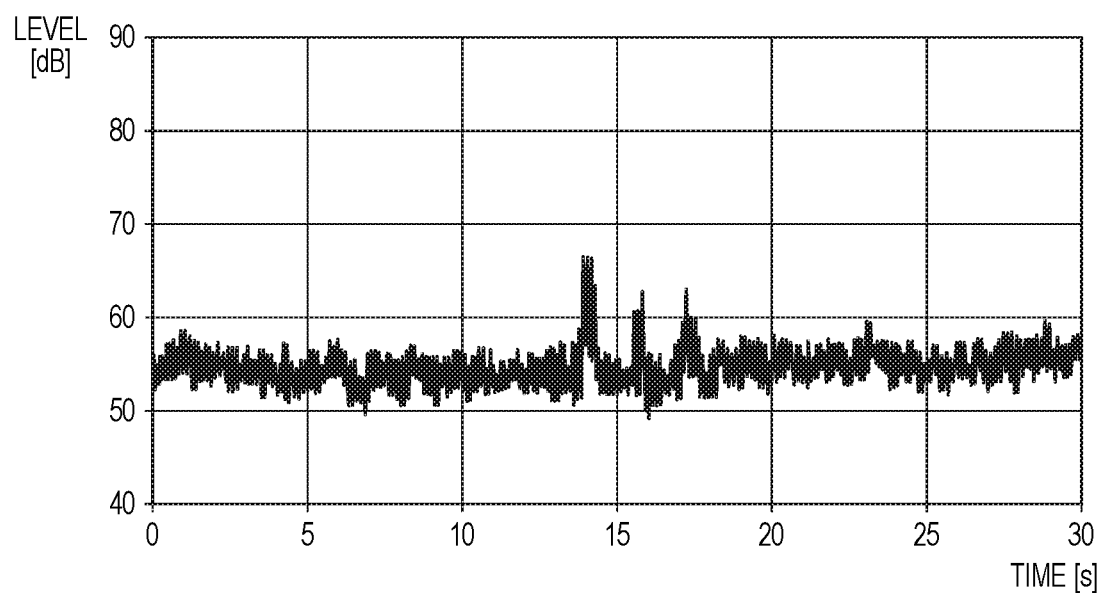
FIG. 8C is a graph showing a temporal change of an estimated noise level when a noise level limiting unit is provided and a sudden noise is input to a microphone.

Next, effects obtained by providing the noise level limiting unit 43 will be described with reference to FIGS. 8A, 8B, and 8C. FIG. 8A is a graph showing a temporal change of an estimated noise level when a sudden noise is not input to a microphone. FIG. 8B is a graph showing a temporal change of an estimated noise level when the noise level limiting unit 43 is not provided and a sudden noise is input to a microphone. FIG. 8C is a graph showing a temporal change of an estimated noise level when the noise level limiting unit 43 is provided and a sudden noise is input to a microphone. In the graphs in FIGS. 8A, 8B, and 8C, a horizontal axis indicates time [s], and a vertical axis represents an estimated noise level [dB].

When the noise level limiting unit 43 is not provided, a sudden noise input to the microphone is output as it is as an estimated noise level as shown in the graph in FIG. 8B. In this case, the compensation amount calculation unit 20 calculates a compensation amount by also referring to a component derived from the sudden noise, so that the noise tracking equalizer 12 may unnecessarily increase the sound source level based on the compensation amount.

On the other hand, by providing the noise level limiting unit 43, a sudden noise input to the microphone is limited by the noise level limiting unit 43 as shown in the graph in FIG. 8C. Therefore, a sudden noise component is prevented from being included in the estimated noise level. Accordingly, the compensation amount calculation unit 20 can calculate an appropriate compensation amount, and thus it is possible to prevent the noise tracking equalizer 12 from unnecessarily increasing the sound source level.

Fifth Configuration Example

Figure 9:
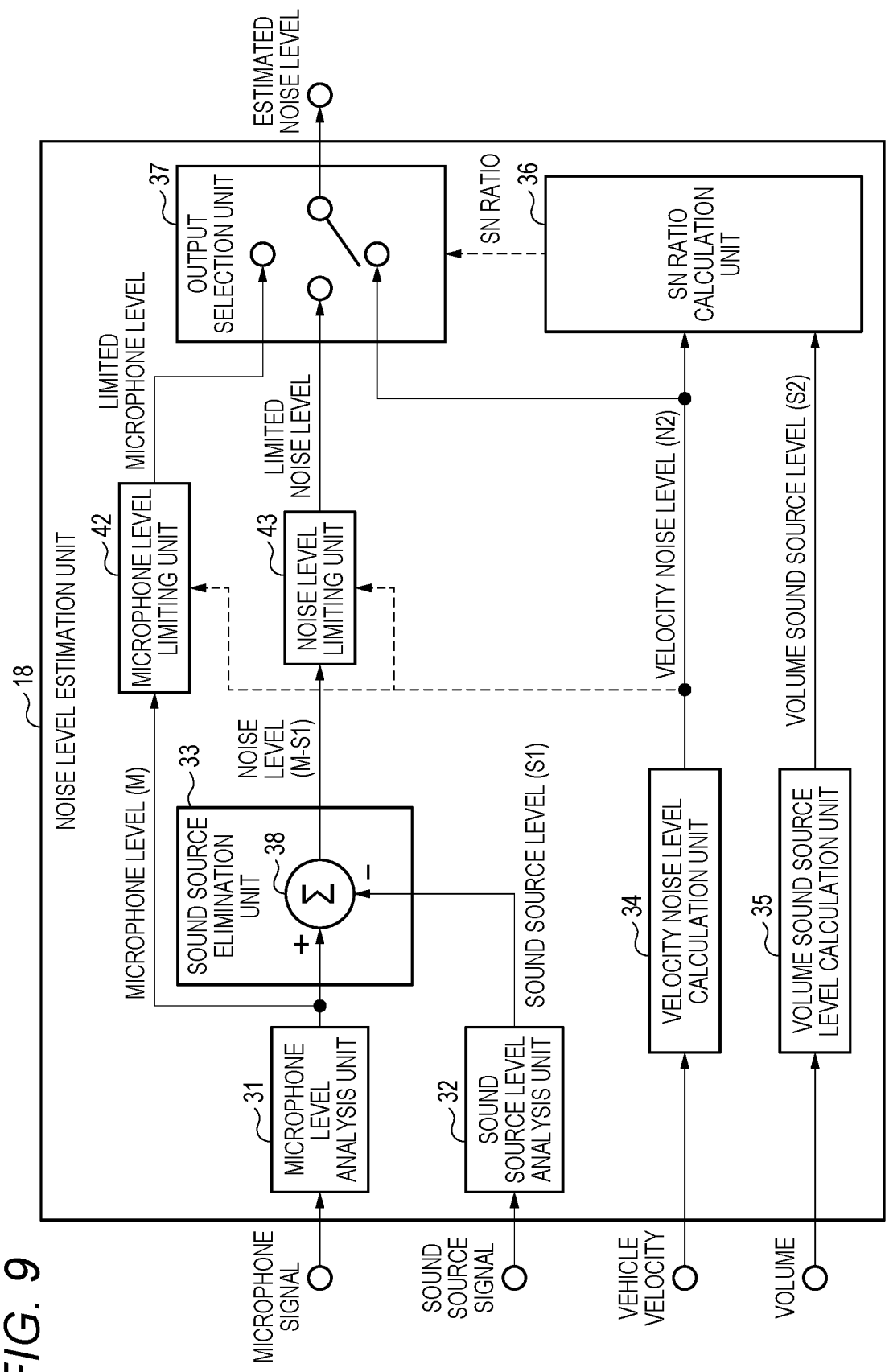
FIG. 9 is a block diagram showing a fifth configuration example of the noise level estimation unit according to the present embodiment.

FIG. 9 is a block diagram showing a fifth configuration example of the noise level estimation unit 18 according to the present embodiment.

The noise level estimation unit 18 according to the fifth configuration example includes the microphone level analysis unit 31, the sound source level analysis unit 32, the sound source elimination unit 33, the velocity noise level calculation unit 34, the volume sound source level calculation unit 35, the SN ratio calculation unit 36, the output selection unit 37, the microphone level limiting unit 42, and the noise level limiting unit 43.

The microphone level analysis unit 31, the sound source level analysis unit 32, the sound source elimination unit 33, the velocity noise level calculation unit 34, the volume sound source level calculation unit 35, and the SN ratio calculation unit 36 perform the same processing as those in the first configuration example.

The microphone level limiting unit 42 limits an upper limit and a lower limit of the microphone level (M) output from the microphone level analysis unit 31 based on the velocity noise level (N2), and outputs, as a limited microphone level, the microphone level which has been limited. For example, the microphone level limiting unit 42 limits the microphone level by the processing of (B1) to (B3) shown in the third configuration example.

The noise level limiting unit 43 limits an upper limit and a lower limit of the noise level (M-S1) output from the sound source elimination unit 33 based on the velocity noise level (N2), and outputs, as a limited noise level, the noise level which has been limited. For example, the noise level limiting unit 43 limits the noise level by the processing of (D1) to (D3) shown in the fourth configuration example.

The output selection unit 37 selects one of the limited microphone level output from the microphone level limiting unit 42, the limited noise level output from the noise level limiting unit 43, and the velocity noise level output from the velocity noise level calculation unit 34 based on the SN ratio output from the SN ratio calculation unit 36, and outputs the selected level as the estimated noise level. For example, the output selection unit 37 performs the following selection (F1) to (F3).

(F1) When the SN ratio is smaller than the predetermined threshold Th0, the output selection unit 37 selects the limited microphone level and outputs the limited microphone level as an estimated noise level.

(F2) When the SN ratio is larger than the predetermined threshold Th1, the output selection unit 37 selects the velocity noise level (N2) and outputs the velocity noise level (N2) as an estimated noise level. The threshold Th1 is larger than the threshold Th0.

(F3) When the SN ratio satisfies neither the condition in (F1) nor the condition in (F2), the output selection unit 37 selects the limited noise level and outputs the limited noise level as an estimated noise level. That is, when the SN ratio is equal to or larger than the threshold Th0 and also equal to or smaller than the threshold Th1, the output selection unit 37 selects the limited noise level and outputs the limited noise level as an estimated noise level.

The limited microphone level may be included in a level related to the microphone level. The limited noise level may be included in a level related to the noise level. The level related to the microphone level, the level related to the noise level, and the velocity noise level may be included in estimated noise level candidates.

By providing the microphone level limiting unit 42, a sudden noise input to the microphone is limited by the microphone level limiting unit 42. Therefore, it is possible to prevent a sudden noise component from being included in the limited microphone level. Accordingly, even when a sudden noise is included in the microphone level, the limited microphone level is output as an estimated noise level, and therefore, the compensation amount calculation unit 20 can calculate an appropriate compensation amount.

In addition, by providing the noise level limiting unit 43, the limited noise level is output as an estimated noise level even when a sudden noise is included in the microphone level as in a case of the fourth configuration example, and therefore, the compensation amount calculation unit 20 can calculate an appropriate compensation amount.

Therefore, according to the fifth configuration example, it is possible to prevent the noise tracking equalizer 12 from unnecessarily increasing the sound source level.

Figure 10:
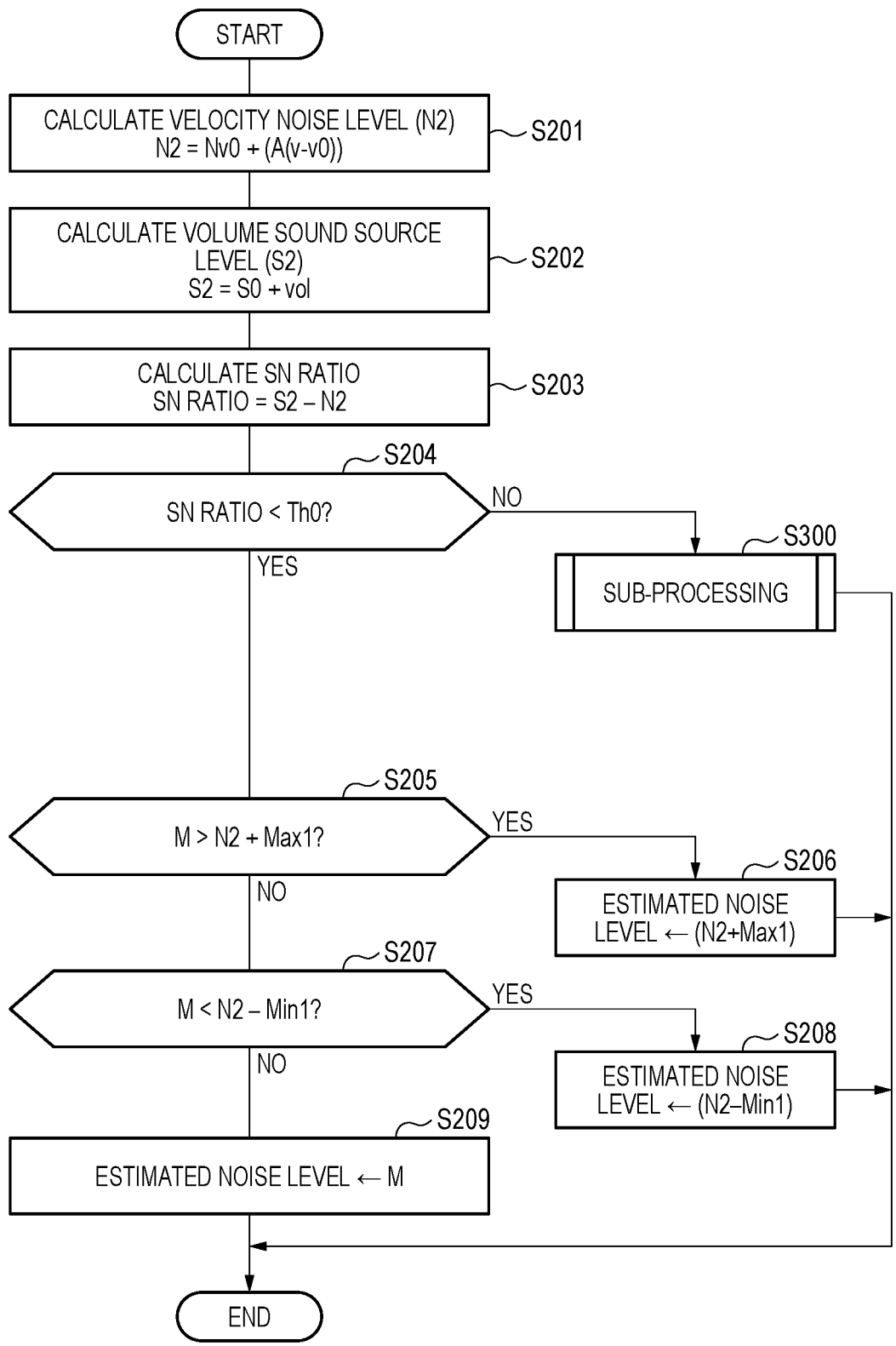
FIG. 10 is a flowchart showing an example of processing performed by the noise level estimation unit according to the fifth configuration example.

FIG. 10 is a flowchart showing an example of processing performed by the noise level estimation unit 18 according to the fifth configuration example.

The noise level estimation unit 18 calculates the velocity noise level (N2) by the following Equation (1) (S201).

$$N2 = Nv0 + (A(v - v0)) \quad (1)$$

The noise level estimation unit 18 calculates the volume sound source level (S2) by the following Equation (2) (S202).

$$S2 = S0 + vol \quad (2)$$

The noise level estimation unit 18 calculates an SN ratio between the volume sound source level (S2) and the velocity noise level (N2) by the following Equation (3) (S203).

$$(SN\ \text{Ratio}) = S2 - N2 \quad (3)$$

The noise level estimation unit 18 determines whether SN ratio<threshold Th0 is satisfied (S204).

When SN ratio≥threshold Th0 is satisfied (S204: NO), the noise level estimation unit 18 performs sub-processing (S300), and ends the processing. Details of the sub-processing will be described later (see FIG. 11).

When SN ratio<threshold Th0 is satisfied (S204: YES), the noise level estimation unit 18 determines whether M>(N2+Max1) is satisfied (S205).

When M>(N2+Max1) is satisfied (S205: YES), the noise level estimation unit 18 outputs the limited microphone level (N2+Max1) as an estimated noise level (S206). That is, the noise level estimation unit 18 outputs, as a noise estimation level, the limited microphone level limited to an upper limit (N2+Max1) by the microphone level limiting unit 42. Then, the noise level estimation unit 18 ends the present processing.

When M≥(N2+Max1) is satisfied (S205: NO), the noise level estimation unit 18 determines whether M<(N2−Min1) is satisfied (S207).

When M<(N2−Min1) is satisfied (S207: YES), the noise level estimation unit 18 outputs the limited microphone level (N2−Min1) as an estimated noise level (S208). That is, the noise level estimation unit 18 outputs, as an estimated noise level, the limited microphone level limited to a lower limit (N2−Min1) by the microphone level limiting unit 42. Then, the noise level estimation unit 18 ends the present processing.

When M≥(N2−Min1) is satisfied (S207: NO), the noise level estimation unit 18 outputs the limited microphone level (in this case, the microphone level (M)) as an estimated noise level (S209). That is, the noise level estimation unit 18 outputs the microphone level (M) that is not limited by the microphone level limiting unit 42 as it is as an estimated noise level. Then, the noise level estimation unit 18 ends the present processing.

Figure 11:
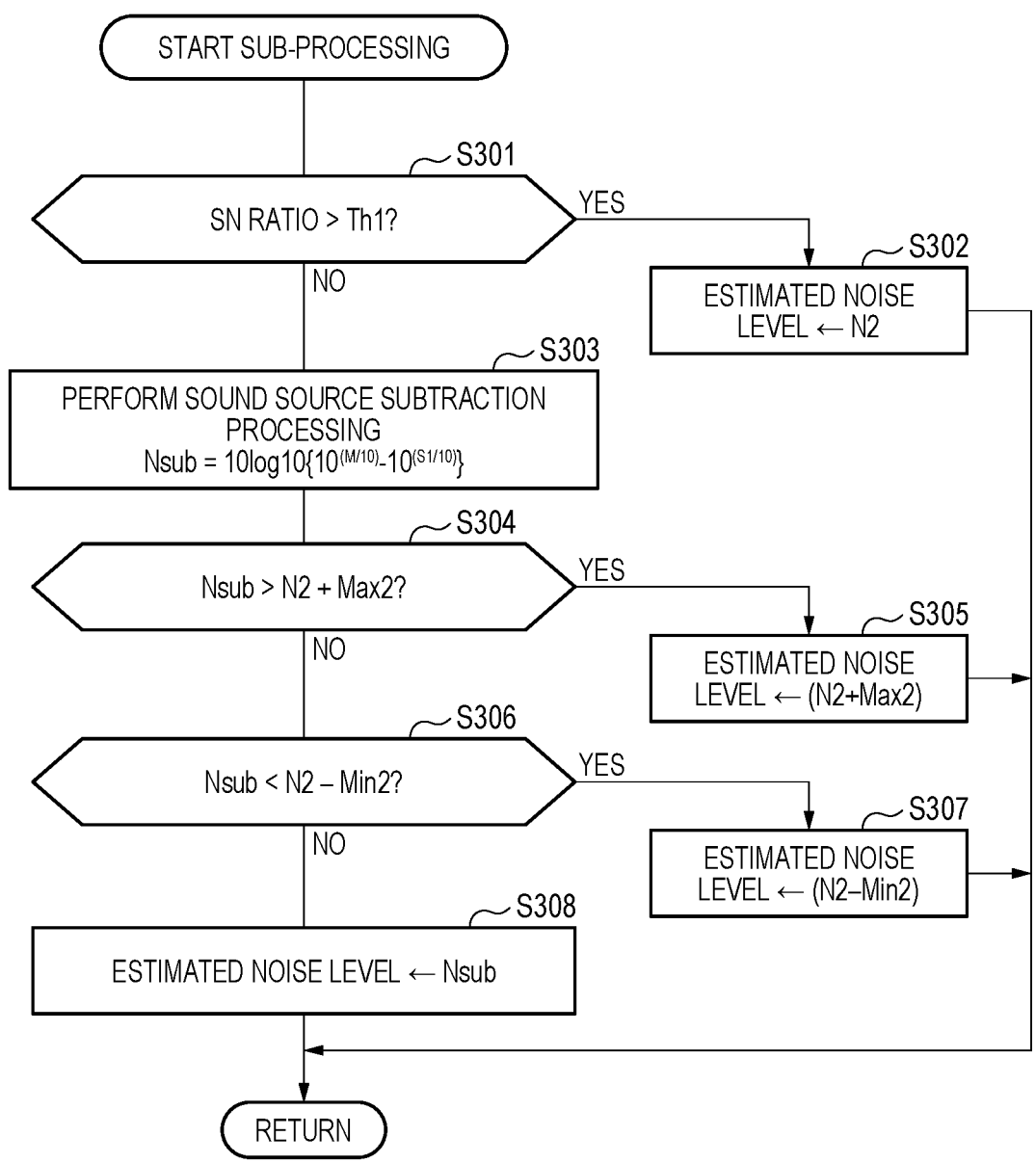
FIG. 11 is a flowchart showing an example of sub-processing shown in FIG. 10.

FIG. 11 is a flowchart showing an example of the sub-processing (S300) shown in FIG. 10.

The noise level estimation unit 18 determines whether SN ratio>threshold Th1 is satisfied (S301).

When SN ratio>threshold Th1 is satisfied (S301: YES), the noise level estimation unit 18 outputs the velocity noise level (N2) as an estimated noise level (S302). Then, the noise level estimation unit 18 returns to the processing of step S300 and subsequent steps in FIG. 10.

When SN ratio≤threshold Th1 is satisfied (S301: NO), the noise level estimation unit 18 calculates the noise level Nsub by the following Equation (4) (S303).

$$N_{sub} = 10 \log 10 \{10^{(M/10)} - 10^{(S1/10)}\} \quad (4)$$

The noise level estimation unit 18 determines whether Nsub>(N2+Max2) is satisfied (S304).

When Nsub>(N2+Max2) is satisfied (S304: YES), the noise level estimation unit 18 outputs the limited noise level (N2+Max2) as an estimated noise level (S305). That is, the noise level estimation unit 18 outputs the limited noise level limited to the upper limit (N2+Max2) by the noise level limiting unit 43 as an estimated noise level. Then, the noise level estimation unit 18 returns to the processing of step S300 and subsequent steps in FIG. 10.

When Nsub≤(N2+Max2) is satisfied (S304: NO), the noise level estimation unit 18 determines whether Nsub<(N2−Min2) is satisfied (S306).

When Nsub<(N2−Min2) is satisfied (S306: YES), the noise level estimation unit 18 outputs the limited noise level (N2−Min2) as an estimated noise level (S308). That is, the noise level estimation unit 18 outputs the limited noise level limited to the lower limit (N2−Min2) by the noise level limiting unit 43 as an estimated noise level. Then, the noise level estimation unit 18 returns to the processing of step S300 and subsequent steps in FIG. 10.

When Nsub≥(N2−Min2) is satisfied (S306: NO), the noise level estimation unit 18 outputs the limited noise level (in this case, the noise level (Nsub)) as an estimated noise level (S308). That is, the noise level estimation unit 18 outputs the noise level that is not limited by the noise level limiting unit 43 as it is as an estimated noise level. Then, the noise level estimation unit 18 returns to the processing of step S300 and subsequent steps in FIG. 10.

SUMMARY OF PRESENT DISCLOSURE

The contents of the present disclosure can be expressed as in the following supplementary notes.

<Supplementary Note 1>

An acoustic processing device 10 mountable on a vehicle according to the present disclosure includes a sound source elimination unit 33, a velocity noise level calculation unit 34, a volume sound source level calculation unit 35, an SN ratio calculation unit 36, and an output selection unit 37.

The sound source elimination unit 33 outputs a noise level obtained by subtracting a sound source level from a microphone level. The microphone level indicates a frequency characteristic of a microphone signal collected by a microphone provided in the vehicle. The sound source level indicates a frequency characteristic of a sound source signal to be input to a speaker provided in the vehicle.

The velocity noise level calculation unit 34 outputs a velocity noise level indicating a frequency characteristic of a noise based on a velocity of the vehicle.

The volume sound source level calculation unit 35 outputs a volume sound source level indicating a frequency characteristic based on a volume of a predetermined sound source signal.

The SN ratio calculation unit 36 outputs an SN ratio which is a ratio between the volume sound source level and the velocity noise level.

The output selection unit 37 selects one of estimated noise level candidates based on the SN ratio, the estimated noise level candidates including a level related to the noise level and the velocity noise level based on the SN ratio, and the output selection unit 37 outputs a selected one of the estimated noise level candidates as an estimated noise level.

Accordingly, even when the SN ratio changes, the acoustic processing device 10 can output an estimated noise level having a small error from a noise level actually measured in the vehicle. Therefore, the acoustic processing device 10 calculates a compensation amount using the estimated noise level and adjusts the sound source level using the compensation amount, so that it is possible to provide an acoustic output with a volume and a quality that are appropriate in terms of audibility.

<Supplementary Note 2>

In the acoustic processing device 10 described in Supplementary Note 1, the output selection unit 37 selects the velocity noise level in response to the SN ratio being larger than a first threshold.

Accordingly, the acoustic processing device 10 can output an estimated noise level having a smaller error from a noise level actually measured in the vehicle between a case where the SN ratio is larger than a first threshold and a case where the SN ratio is equal to or smaller than the first threshold.

<Supplementary Note 3>

The acoustic processing device 10 described in Supplementary Note 1 or 2 further includes a noise level limiting unit 43 that outputs a limited noise level obtained by limiting the noise level based on the velocity noise level. The level related to the noise level in the estimated noise level candidates is the limited noise level.

Accordingly, a sudden noise is prevented from being included in the estimated noise level. Therefore, the acoustic processing device 10 can prevent unnecessary adjustment on the sound source level when the sound source level is adjusted using the compensation amount.

<Supplementary Note 4>

In the acoustic processing device 10 described in Supplementary Note 1, the estimated noise level candidates further include a level related to the microphone level, and the output selection unit 37 selects, based on the SN ratio, one of the estimated noise level candidates including the level related to the microphone level, the level related to the noise level, and the velocity noise level, and outputs a selected one of the estimated noise level candidates as the estimated noise level.

Accordingly, even when the SN ratio changes, the acoustic processing device 10 can output an estimated noise level having a small error from a noise level actually measured in the vehicle.

<Supplementary Note 5>

In the acoustic processing device 10 described in Supplementary Note 4, the output selection unit 37 selects the level related to the microphone level in response to the SN ratio being smaller than a first threshold, selects the velocity noise level in response to the SN ratio being larger than a second threshold, the second threshold being larger than the first threshold, and selects the level related to the noise level in response to the SN ratio being equal to or larger than the first threshold and also equal to or smaller than the second threshold.

Accordingly, it is possible to output an estimated noise level having a smaller error from a noise level actually measured in the vehicle among a case where the SN ratio is smaller than the first threshold, a case where the SN ratio is larger than the second threshold, and other cases.

<Supplementary Note 6>

The acoustic processing device 10 described in Supplementary Note 4 or 5 further includes a microphone level limiting unit 42 that outputs a limited microphone level obtained by limiting the microphone level based on the velocity noise level. The level related to the microphone level in the estimated noise level candidates is the limited microphone level.

Accordingly, a sudden noise is prevented from being included in the estimated noise level. Therefore, the acoustic processing device 10 can prevent unnecessary adjustment on the sound source level when the sound source level is adjusted using the compensation amount.

<Supplementary Note 7>

The acoustic processing device 10 according to any one of Supplementary Notes 4 to 6 further includes a noise level limiting unit 43 that outputs a limited noise level obtained by limiting the noise level based on the velocity noise level. The level related to the noise level in the estimated noise level candidates is the limited noise level.

Accordingly, a sudden noise is prevented from being included in the estimated noise level. Therefore, the acoustic processing device 10 can prevent unnecessary adjustment on the sound source level when the sound source level is adjusted using the compensation amount.

<Supplementary Note 8>

An acoustic processing device 10 mountable on the vehicle according to the present disclosure includes a sound source elimination unit 33, a velocity noise level calculation unit 34, a volume sound source level calculation unit 35, a microphone level limiting unit 42, an SN ratio calculation unit 36, and an output selection unit 37.

The sound source elimination unit 33 outputs a noise level obtained by subtracting a sound source level from a microphone level. The microphone level indicates a frequency characteristic of a microphone signal collected by a microphone provided in the vehicle. The sound source level indicates a frequency characteristic of a sound source signal to be input to a speaker provided in the vehicle.

The velocity noise level calculation unit 34 outputs a velocity noise level indicating a frequency characteristic of a noise based on a velocity of the vehicle.

The volume sound source level calculation unit 35 outputs a volume sound source level indicating a frequency characteristic based on a volume of a predetermined sound source signal.

The microphone level limiting unit 42 outputs a limited microphone level obtained by limiting a microphone level based on the velocity noise level.

The SN ratio calculation unit 36 outputs an SN ratio which is a ratio between the volume sound source level and the limited microphone level.

The output selection unit 37 selects one of estimated noise level candidates based on the SN ratio, the estimated noise level candidates including the microphone level, the noise level, and the limited microphone level, and outputs a selected one of the estimated noise level candidates as the estimated noise level.

Accordingly, even when the SN ratio changes, the acoustic processing device 10 can output an estimated noise level having a small error from a noise level actually measured in the vehicle. Therefore, the acoustic processing device 10 calculates a compensation amount using the estimated noise level and adjusts the sound source level using the compensation amount, so that it is possible to provide an acoustic output with a volume and a quality that are appropriate in terms of audibility.

<Supplementary Note 9>

An acoustic processing device 10 mountable on a vehicle according to the present disclosure includes a sound source elimination unit 33, a velocity noise level calculation unit 34, a volume sound source level calculation unit 35, n SN ratio calculation unit 36, and an output selection unit 37.

The sound source elimination unit 33 outputs a noise signal obtained by subtracting, using an adaptive filter, a sound source signal from a microphone signal collected by a microphone provided in the vehicle. The sound source signal is a signal to be input to a speaker provided in the vehicle.

The velocity noise level calculation unit 34 outputs a velocity noise level indicating a frequency characteristic of a noise based on a velocity of the vehicle.

The volume sound source level calculation unit 35 outputs a volume sound source level indicating a frequency characteristic based on a volume of a predetermined sound source signal.

The SN ratio calculation unit 36 outputs an SN ratio which is a ratio between the volume sound source level and the velocity noise level.

The output selection unit 37 selects one of estimated noise level candidates based on the SN ratio, the estimated noise level candidates including a microphone level indicating a frequency characteristic of the microphone signal, a noise level indicating a frequency characteristic of the noise signal, and a velocity noise level, and outputs a selected one of the estimated noise level candidates as an estimated noise level.

Accordingly, even when the SN ratio changes, the acoustic processing device 10 can output an estimated noise level having a small error from a noise level actually measured in the vehicle. Therefore, the acoustic processing device 10 calculates a compensation amount using the estimated noise level and adjusts the sound source level using the compensation amount, so that it is possible to provide an acoustic output with a volume and a quality that are appropriate in terms of audibility.

<Supplementary Note 10>

An acoustic processing method by a device mountable on a vehicle according to the present disclosure includes the following processing 1 to 5.

In the processing 1, a noise level obtained by subtracting a sound source level from a microphone level is output. The microphone level indicates a frequency characteristic of a microphone signal collected by a microphone provided in the vehicle. The sound source level indicates a frequency characteristic of a sound source signal to be input to a speaker provided in the vehicle.

In the processing 2, a velocity noise level indicating a frequency characteristic of a noise based on a velocity of the vehicle is output.

In the processing 3, a volume sound source level indicating a frequency characteristic based on a volume of a predetermined sound source signal is output.

In the processing 4, an SN ratio which is a ratio between the volume sound source level and the velocity noise level is output.

In the processing 5, one of estimated noise level candidates is selected based on the SN ratio. The estimated noise level candidates include a level related to the noise level and the velocity noise level is selected based on the SN ratio. A selected one of the estimated noise level candidates is output as the estimated noise level.

According to the acoustic processing method, it is possible to output an estimated noise level having a small error from a noise level actually measured in the vehicle even when the SN ratio changes. Therefore, a device to which the acoustic processing method is applied can provide an acoustic output with a volume and a quality that are appropriate in terms of audibility by calculating a compensation amount using the estimated noise level and adjusting the sound source level using the compensation amount.

Although the embodiment has been described above with reference to the accompanying drawings, the present disclosure is not limited to such an example. It is apparent to those skilled in the art that various modifications, corrections, substitutions, additions, deletions, and equivalents can be conceived within the scope described in the claims, and it should be understood that such modifications, substitutions, additions, deletions, and equivalents also fall within the technical scope of the present disclosure. Components in the above embodiment may be combined as desired within a range not departing from the scope of the invention.

The technology of the present disclosure can be used to an acoustic device mounted on a vehicle.

This application is based on and claims priority under 35 USC 119 from Japanese Patent Application No. 2022-020513 filed on Feb. 14, 2022, the contents of which are incorporated herein by reference.

What is claimed is:

1. An acoustic processing device mountable on a vehicle, the acoustic processing device comprising:
   a memory; and
   a processor that is coupled to the memory, and when executing a program stored in the memory, performs operations comprising:
   outputting a noise level obtained by subtracting a sound source level from a microphone level;
   outputting a velocity noise level indicating a frequency characteristic of a noise based on a velocity of the vehicle;

outputting a volume sound source level indicating a frequency characteristic based on a volume of a predetermined sound source signal;

outputting an SN ratio which is a ratio between the volume sound source level and the velocity noise level;

selecting one of estimated noise level candidates based on the SN ratio, the estimated noise level candidates including a level related to the noise level and the velocity noise level; and outputting a selected one of the estimated noise level candidates as an estimated noise level, wherein the microphone level indicates a frequency characteristic of a microphone signal collected by a microphone provided in the vehicle, and wherein the sound source level indicates a frequency characteristic of a sound source signal to be input to a speaker provided in the vehicle, wherein the estimated noise level candidates further include a level related to the microphone level, and wherein the selecting the one of estimated noise level candidates comprises selecting, based on the SN ratio, one of the estimated noise level candidates including the level related to the microphone level, the level related to the noise level, and the velocity noise level, wherein the selecting the one of estimated noise level candidates comprises:

selecting the level related to the microphone level in response to the SN ratio being smaller than a first threshold;

selecting the velocity noise level in response to the SN ratio being larger than a second threshold, the second threshold being larger than the first threshold; and selecting the level related to the noise level in response to the SN ratio being equal to or larger than the first threshold and also equal to or smaller than the second threshold.

2. The acoustic processing device according to claim 1, wherein the operations further comprise:

outputting a limited microphone level obtained by limiting the noise microphone level based on the velocity noise level, wherein the level related to the microphone level in the estimated noise level candidates is the limited microphone level.

3. The acoustic processing device according to claim 2, wherein the limited microphone level is obtained by limiting at least one of an upper limit and a lower limit of the microphone level.

4. The acoustic processing device according to claim 2, wherein the outputting the limited microphone level comprises, in response to the microphone level being higher than a first level obtained by adding a first value to the velocity noise level, outputting the first level as the limited microphone level.

5. The acoustic processing device according to claim 2, wherein the outputting the limited microphone level comprises, in response to the microphone level being lower than a second level obtained by subtracting a second value from the velocity noise level, outputting the second level as the limited microphone level.

6. The acoustic processing device according to claim 1, wherein the operations further comprise:

outputting the microphone level as the level related to the microphone level in response to the microphone level being equal to or lower than a first level obtained by adding a first value to the velocity noise level and also equal to or higher than a second level obtained by subtracting a second value from the velocity noise level.

7. The acoustic processing device according to claim 1, wherein the operations further comprise:

outputting a limited noise level obtained by limiting the noise level based on the velocity noise level, wherein the level related to the noise level in the estimated noise level candidates is the limited noise level.

8. The acoustic processing device according to claim 7, wherein the limited noise level is obtained by limiting at least one of an upper limit and a lower limit of the noise level.

9. The acoustic processing device according to claim 7, wherein the outputting the limited noise level comprises, in response to the noise level being higher than a third level obtained by adding a third value to the velocity noise level, outputting the third level as the limited noise level.

10. The acoustic processing device according to claim 7, wherein the outputting the limited noise level comprises, in response to the noise level being lower than a fourth level obtained by subtracting a fourth value from the velocity noise level, outputting the fourth level as the limited noise level.

11. The acoustic processing device according to claim 1, wherein the operations further comprise:

outputting the noise level as the level related to the noise level in response to the noise level being equal to or lower than a third level obtained by adding a third value to the velocity noise level and also equal to or higher than a fourth level obtained by subtracting a fourth value from the velocity noise level.

12. An acoustic processing method by a device mountable on a vehicle, the acoustic processing method comprising:

outputting a noise level obtained by subtracting a sound source level from a microphone level;

outputting a velocity noise level indicating a frequency characteristic of a noise based on a velocity of the vehicle;

outputting a volume sound source level indicating a frequency characteristic based on a volume of a predetermined sound source signal;

outputting an SN ratio which is a ratio between the volume sound source level and the velocity noise level;

selecting one of estimated noise level candidates based on the SN ratio, the estimated noise level candidates including a level related to the noise level and the velocity noise level based on the SN ratio; and outputting a selected one of the estimated noise level candidates as an estimated noise level, wherein the microphone level indicates a frequency characteristic of a microphone signal collected by a microphone provided in the vehicle, and wherein the sound source level indicates a frequency characteristic of a sound source signal to be input to a speaker provided in the vehicle, wherein the estimated noise level candidates further include a level related to the microphone level, wherein the selecting the one of estimated noise level candidates comprises selecting, based on the SN ratio, one of the estimated noise level candidates including the level related to the microphone level, the level related to the noise level, and the velocity noise level, wherein the acoustic processing method further comprises:

outputting a limited noise level obtained by limiting the noise level based on the velocity noise level, wherein the level related to the noise level in the estimated noise level candidates is the limited noise level, and wherein the limited noise level is obtained by limiting at least one of an upper limit and a lower limit of the noise level.

13. The acoustic processing device method according to claim 12, wherein the selecting the one of estimated noise level candidates comprises selecting the velocity noise level in response to the SN ratio being larger than a first threshold.

14. The acoustic processing device method according to claim 12, wherein the selecting the one of estimated noise level candidates comprises:

selecting the level related to the microphone level in response to the SN ratio being smaller than a first threshold;

selecting the velocity noise level in response to the SN ratio being larger than a second threshold, the second threshold being larger than the first threshold; and selecting the level related to the noise level in response to the SN ratio being equal to or larger than the first threshold and also equal to or smaller than the second threshold.

15. An acoustic processing method by a device mountable on a vehicle, the acoustic processing method comprising:

outputting a noise level obtained by subtracting a sound source level from a microphone level;

outputting a velocity noise level indicating a frequency characteristic of a noise based on a velocity of the vehicle;

outputting a volume sound source level indicating a frequency characteristic based on a volume of a predetermined sound source signal;

outputting an SN ratio which is a ratio between the volume sound source level and the velocity noise level;

selecting one of estimated noise level candidates based on the SN ratio, the estimated noise level candidates including a level related to the noise level and the velocity noise level based on the SN ratio; and outputting a selected one of the estimated noise level candidates as an estimated noise level, wherein the microphone level indicates a frequency characteristic of a microphone signal collected by a microphone provided in the vehicle, and wherein the sound source level indicates a frequency characteristic of a sound source signal to be input to a speaker provided in the vehicle, wherein the estimated noise level candidates further include a level related to the microphone level, wherein the selecting the one of estimated noise level candidates comprises selecting, based on the SN ratio, one of the estimated noise level candidates including the level related to the microphone level, the level related to the noise level, and the velocity noise level, wherein the acoustic processing method further comprises:

outputting the noise level as the level related to the noise level in response to the noise level being equal to or lower than a third level obtained by adding a third value to the velocity noise level and also equal to or higher than a fourth level obtained by subtracting a fourth value from the velocity noise level.

16. The acoustic processing method according to claim 15, further comprising:

outputting a limited noise level obtained by limiting the noise level based on the velocity noise level, wherein the level related to the noise level in the estimated noise level candidates is the limited noise level.

* * * * *